(12) United States Patent
Grivna

(10) Patent No.: US 11,978,671 B2
(45) Date of Patent: May 7, 2024

(54) PROCESS OF FORMING AN ELECTRONIC DEVICE INCLUDING A POLYMER SUPPORT LAYER

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 78 days.

(21) Appl. No.: 17/663,863

(22) Filed: May 18, 2022

(65) Prior Publication Data
US 2022/0277999 A1    Sep. 1, 2022

Related U.S. Application Data

(62) Division of application No. 16/661,776, filed on Oct. 23, 2019, now Pat. No. 11,367,657.
(Continued)

(51) Int. Cl.
| H01L 21/78 | (2006.01) |
| H01L 23/00 | (2006.01) |
(Continued)

(52) U.S. Cl.
CPC .......... H01L 21/7806 (2013.01); H01L 21/78 (2013.01); H01L 24/94 (2013.01);
(Continued)

(58) Field of Classification Search
CPC ............. H01L 29/7786; H01L 29/7781; H01L 29/402; H01L 29/2003; H01L 29/66431;
(Continued)

(56) References Cited

U.S. PATENT DOCUMENTS

| 6,107,164 A * | 8/2000 | Ohuchi ................... H01L 24/11 |
| | | 438/114 |
| 7,221,059 B2 * | 5/2007 | Farnworth .......... H01L 21/3043 |
| | | 257/E21.597 |

(Continued)

FOREIGN PATENT DOCUMENTS

EP    2075825 A1    7/2009

OTHER PUBLICATIONS

Hichri et al.; "Excimer Laser Ablation for Microvia and Fine RDL Routings for Advanced Packaging"; Chip Scale Review; Sep.-Oct. 2017; pp. 1 to 4.
(Continued)

*Primary Examiner* — Michael M Trinh
(74) *Attorney, Agent, or Firm* — Abel Schillinger, LLP

(57) ABSTRACT

A process can be used to allow processing of thin layers of a workpiece including dies. The workpiece can include a base substrate and a plurality of layers overlying the base substrate. The process can include forming a polymer support layer over the plurality of layers; thinning or removing the base substrate within a component region of the workpiece, wherein the component region includes an electronic device; and singulating the workpiece into a plurality of dies after thinning or removing the base substrate. In another aspect, an electronic device can be formed using such process. In an embodiment, the workpiece may have a size corresponding to a semiconductor wafer to allow wafer-level, as opposed to die-level, processing.

20 Claims, 13 Drawing Sheets

Related U.S. Application Data

(60) Provisional application No. 62/881,661, filed on Aug. 1, 2019.

(51) Int. Cl.
  *H01L 29/66* (2006.01)
  *H01L 29/778* (2006.01)

(52) U.S. Cl.
  CPC ........ *H01L 24/96* (2013.01); *H01L 29/66431* (2013.01); *H01L 29/7786* (2013.01); *H01L 2224/94* (2013.01)

(58) Field of Classification Search
  CPC .................. H01L 21/78; H01L 21/7806; H01L 21/02013; H01L 21/02016; H01L 24/03; H01L 24/94; H01L 24/96; H01L 2224/03; H01L 2224/11; H01L 2224/94
  See application file for complete search history.

(56) References Cited

U.S. PATENT DOCUMENTS

| | | | |
|---|---|---|---|
| 10,090,199 | B2 | 10/2018 | Grivna et al. |
| 2003/0032216 | A1 | 2/2003 | Nakaoka et al. |
| 2009/0315071 | A1* | 12/2009 | Iwabuchi ............ H01L 29/0653 257/E29.183 |
| 2010/0006864 | A1 | 1/2010 | Steigerwald |
| 2012/0142165 | A1* | 6/2012 | Huang .................... H01L 24/96 257/E21.599 |
| 2014/0210054 | A1 | 7/2014 | Kosub et al. |
| 2018/0033669 | A1 | 2/2018 | Salih et al. |
| 2018/0254259 | A1 | 9/2018 | Grivna |
| 2019/0035687 | A1 | 1/2019 | Grivna et al. |
| 2019/0148340 | A1* | 5/2019 | Yu .......................... H01L 25/50 257/737 |

OTHER PUBLICATIONS

Lerner et al.; "Integration of GaN HEMTs onto Silicon CMOS by Micro Transfer Printing"; Proc. of the 2016 28th Int'l Symp. on Power Semiconductor Devices and ICs; IEEE; 2016; pp. 451-454.

Hanft et al.; "An Overview of the Aerosol Deposition Method: Process Fundamentals and New Trends in Materials Applications"; J. Ceram. Sci. Tech.; vol. 6, No. 3; 2015; pp. 147-182.

Strothmann et al.; "Encapsulated Wafer Level Package Technology (eWLCSP)"; 2014 Electronic Components and Technology Conference Proceedings; IEEE; 2014; pp. 931-934.

Gingerella; Excimer Laser Via-Drilling—Options to Further Capabilities of Next Generation Wafer Level Processing Devices; SUSS Report; SUSS MicroTec Photonic Systems Inc.; 2014; pp. 1 to 5.

Shahien et al.; "In Situ Fabrication of AlN Coating by Reactive Plasma Spraying of Al/AlN Powder"; Coatings; 2011; pp. 88 to 107.

Chung et al.; "GaN-on-Si Technology, a New Approach for Advanced Devices in Energy and Communications"; Proc. of the European Solid-State Device Research Conference 2010; IEEE; 2010; pp. 52-56.

Chumbes et al.; "AlGaN/GaN High Electron Mobility Transistors on Si(111) Substrates"; IEEE Trans. on Electronic Devices; IEEE; 2001; pp. 420-426.

\* cited by examiner

PROCESS OF FORMING AN ELECTRONIC DEVICE INCLUDING A POLYMER SUPPORT LAYER

CROSS REFERENCE TO RELATED APPLICATIONS

This application is a divisional of and claims priority under 35 U.S.C. § 120 to U.S. patent application Ser. No. 16/661,776 entitled "Electronic Device Including a Polymer Support Layer and a Process of Forming the Same," by Gordon M. Grivna, filed Oct. 23, 2019, which claims priority under 35 U.S.C. § 119(e) to U.S. Patent Application No. 62/881,661 entitled "Electronic Device Including a Polymer Support Layer and a Process of Forming the Same," by Gordon M. Grivna, filed Aug. 1, 2019, all of which are assigned to the current assignee hereof and incorporated herein by reference in their entireties.

FIELD OF THE DISCLOSURE

The present disclosure relates to processes and electronic devices, and in particular to processes for removing at least portions of base substrates from workpieces and electronic devices formed therefrom.

RELATED ART

A die including an electronic device may have all or nearly all of a semiconductor wafer removed from under device layers within a component region of the die. The cumulative thickness of the device layers can be in a range of 2 microns to 7 microns thick. When the area of the electronic device is small, such as for a singulated die, the relatively thin cumulative thickness of the device layers may have sufficient mechanical support by themselves. However, as the size of a substrate associated with the electronic device increases, for example, when the substrate has a diameter of 100 mm or greater, such a relatively thin cumulative thickness for the device layers, by themselves, may not provide sufficient mechanical support.

A complex processing sequence may be used to attach and remove substrates as described in Chung, J. W. et al.; "GaN-on-Si Technology, a New Approach for Advanced Devices in Energy and Communications"; *Proceedings of the European Solid-State Device Research Conference* 2010; IEEE, pp. 52 to 56 (2010). Such complex processing may not be needed and can result in lower yield in view of the process flow. Improvements in processing of workpieces including relatively thin electronic devices are desired.

BRIEF DESCRIPTION OF THE DRAWINGS

Embodiments are illustrated by way of example and are not limited in the accompanying figures.

Figure 1:
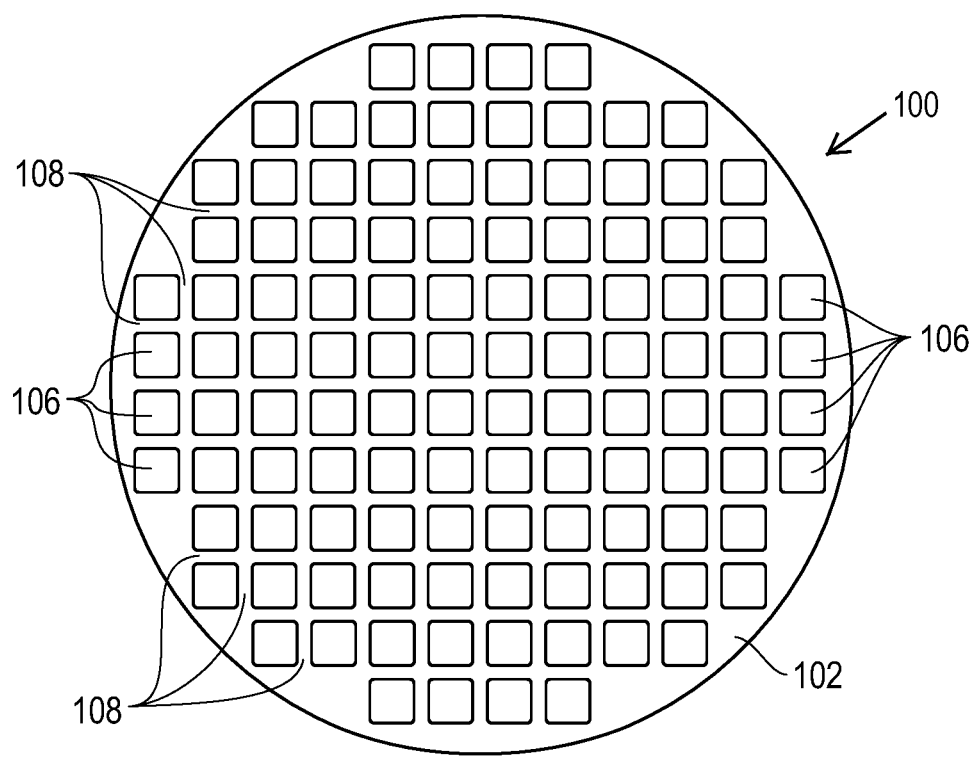
FIG. 1 includes an illustration of a top view of a workpiece including component regions and scribe lanes.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "width" is intended to mean a dimension as measured across a major surface of a substrate. When the substrate has dissimilar dimensions along a major surface, the larger dimension is the length, and the smaller dimension is the width. When the dimensions along the major surface are the same (for example, a square) or uniform (for example, a diameter of a circle), such dimensions are referred to herein as widths. For a non-equilateral, rectangular substrate (not a square substrate), a width of such substrate along the major surface is less than a length of the substrate along the major surface. For a major surface of a substrate having dimensions that can be characterized by a minor axis and a major axis (for example, an elliptical-shaped or oval-shaped substrate), the minor axis corresponds to a width, and the major axis corresponds to a length. Height and thickness of a layer, a structure, or other feature associated with the substrate is measured in a direction perpendicular to the major surface.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not explicitly listed or inherent to such method, article, or apparatus. Further, unless explicitly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (up to 20% for dopant concentrations) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Embodiments as described herein allow for processing of workpieces having at least portions of relatively thin layers that may become exposed during processing. In an embodiment, a workpiece can have a permanently attached polymer support layer that helps to provide sufficient mechanical support during subsequent processing operations. With the use of the permanently attached polymer support layer, relatively thick base substrates do not need to be retained through singulation and die packaging. Accordingly, a workpiece substantially larger than a die can be processed so that a process sequence may only need to be performed once for many dies, as opposed to performing the process sequence for each die, which could be more than 100 times for each semiconductor wafer. The process is well suited for electronic devices where a thick base substrate may not provide the best electrical characteristics (for example, a thick Si substrate over a III-V semiconductor device may be undesired, resistance associated with a drain or collector may be higher as a semiconductor substrate is thicker, or the like).

Many embodiments can use one or more polymer support layers to ensure the workpiece has a sufficient thickness to allow processing to be performed at a wafer level without significant risk of relatively thin device layers becoming damaged during processing. If needed or desired, spacer structures can be used to assist in ensuring a sufficient thickness of a polymer support layer remains.

In an aspect, a process can include providing a workpiece having a first major surface and a second major surface opposite the first major surface, wherein the workpiece includes a base substrate and a plurality of layers overlying the base substrate, wherein the plurality of layers is closer to the first major surface than the second major surface; forming a polymer support layer along the first major surface of the workpiece; removing at least 50% of a thickness of the base substrate within a component region of the workpiece, wherein the component region includes an electronic device, and after removing at least 50% of the thickness of the base substrate, a combined thickness of the workpiece and polymer support layer within the component region is at least 30 microns and singulating the workpiece into a plurality of dies after removing at least 50% of the thickness of the base substrate.

In another aspect, a process can include providing a workpiece having a first major surface and a second major surface opposite the first major surface, wherein the workpiece includes a base substrate and a plurality of layers overlying the base substrate, wherein the plurality of layers is closer to the first major surface than to the second major surface; forming a trench along the first major surface of the workpiece and extending at least to the base substrate; forming a polymer support layer that extends into the trench and contacts the base substrate; removing at least a portion of a thickness of the base substrate within a component region to expose the polymer support layer within the trench, wherein within the trench and after removing at least the portion of the base substrate, the polymer support layer has a height of at least 30 microns as measured within the trench, and the component region includes an electronic device; and singulating the workpiece into a plurality of dies after removing at least a portion of the thickness of the base substrate.

In a further aspect, an electronic device can include a plurality of layers having a first major surface and a second major surface opposite the first major surface; a polymer support layer along the first major surface of the workpiece, wherein within a component region, a combined thickness of polymer support layer and the plurality of layers is at least 30 microns; and a back-side member along the second major surface, wherein at least one peripheral side of the polymer support layer and at least one peripheral side of the back-side member are substantially coterminous.

FIG. 1 includes an illustration of a top view of a front-side (device-side) major surface of a workpiece 100. A back-side major surface is opposite the front-side major surface and is not seen in FIG. 1. The workpiece 100 includes a base substrate 102, component regions 106, and scribe lanes 108 between the component regions 106. Device layers are not illustrated in FIG. 1 and are described in more detail with respect to FIGS. 2 and 3 below. In an embodiment, the semiconductor material of the base substrate 102 can include a monocrystalline Group 14 element (e.g., silicon or germanium), a III-V semiconductor material, or a II-VI semiconductor material. In a particular embodiment, the base substrate 102 can be a semiconductor wafer. The base substrate 102 has two major surfaces along opposite sides of the base substrate 102. The component regions 106 are formed along a major surface of the base substrate 102 closer to the front-side major surface of the workpiece 100.

In the embodiment as illustrated, the base substrate 102 is circular and has a diameter, which is a type of width, along the major surface. The base substrate 102 may have another shape, such as a square, a rectangle, an ellipse, or the like. The base substrate 102 can have a width (diameter in the embodiment illustrated) of at least 100 mm. As the width increases, more mechanical support may be needed or desired. Thus, the base substrate 102 having a width of at least 150 mm may be thicker as compared to a width of 100 mm, the base substrate 102 having a width of at least 200 mm may be thicker as compared to a width of 150 mm, the base substrate 102 having a width of at least 300 mm may be thicker as compared to a width of 200 mm, etc. Although there may not be a theoretical limit to the width, the base substrate 102 may have a width of at most 400 mm.

Figure 2:
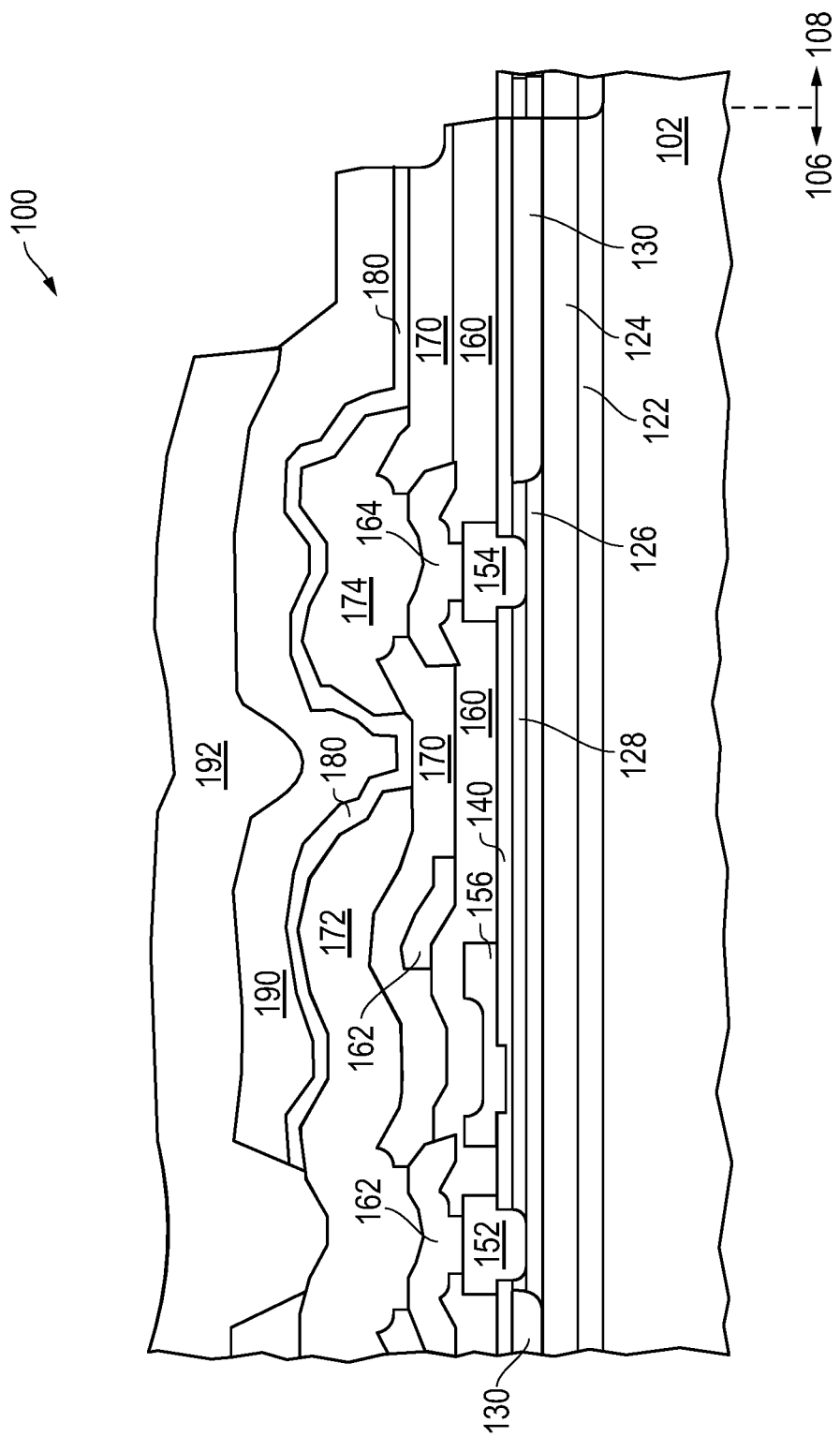
FIG. 2 includes an illustration of a cross-sectional view of a portion of the workpiece of FIG. 1 including an exemplary device structure within a component region.
Figure 3:
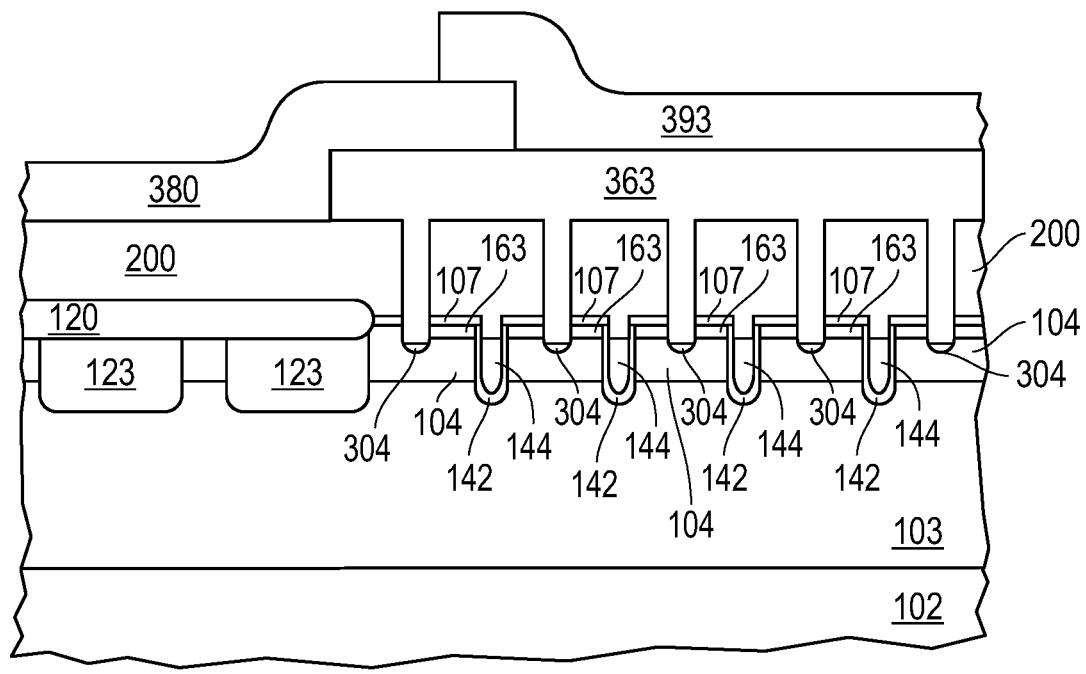
FIG. 3 includes an illustration of a cross-sectional view of a portion of the workpiece of FIG. 1 including another exemplary device structure within a component region.

Many different types of electronic components may be within the component regions. FIGS. 2 and 3 include of cross-sectional views of exemplary components to illustrate a couple of different types of electronic components that may be within the component regions. The electronic devices as illustrated and described in FIGS. 2 and 3 are not meant to limit the scope of the present invention, as defined in the appended claims.

FIG. 2 includes a cross-sectional view of a high electron mobility transistor (HEMT) within a component region 106 of an electronic device. A nucleation layer 122, a buffer layer 124, a channel layer 126, and a barrier layer 128 overlie the base substrate 102. Any one or more of the layers 122, 124, 126, and 128 can be a semiconductor layer that includes a semiconductor material having a bandgap energy greater than the bandgap energy of the semiconductor material of the base substrate 102. The semiconductor material of any one or more of the layers 122, 124, 126, and 128 can include a compound semiconductor material. The compound semiconductor material can include a III-V compound, or a II-VI compound. The III-V compound can include III N, III-P, III-As, and the III element may be Al, Ga, In, or any combination thereof. The II-VI compound can include II-O, II-S, II-Se, or II-Te, and the II element can include Zn, Cd, Hg, Pb, or the like.

In another embodiment, any one or more of the layers 122, 124, 126, and 128 can include $Al_xGa_{(1-x)}N$, where $0 \le x \le 1$. In a more particular embodiment, the nucleation layer 122 includes AlN, the buffer layer 124 includes $Al_yGa_{(1-y)}N$, where $0 \le y < 1$, where y decreases as distance from the nucleation layer 122 increases, the channel layer 126 includes GaN, and the barrier layer 128 includes $Al_zGa_{(1-z)}N$, where $0 < z \le 0.5$. A heterojunction can be present at the interface between any one or more pairs of layers 122, 124, 126, and 128. A two-dimensional charge carrier gas may be associated with the heterojunctions. For example, a two-dimensional electron gas (2DEG) may be present along at least part of the heterojunction between the channel layer 126 and the barrier layer 128. A two-dimensional hole gas may or may not be present within the HEMT. Isolation regions 130 help to isolate the transistor structure from other transistor structures (not illustrated) that may be present within the component region. The isolation regions 130 can be formed by implanting nitrogen ions.

A dielectric layer 140 can include one or more dielectric films. The dielectric layer 140 is etched to define openings, and source and drain electrodes 152 and 154 are formed. The openings for the source and drain electrodes 152 and 154 may extend to an upper surface of the barrier layer 128, partly through the barrier layer 128, or completely through the barrier layer 128, as illustrated in FIG. 2. An opening is formed partly or completely through the dielectric layer 140, and a gate electrode 156 is formed within the opening. The HEMT may be a depletion-mode HEMT or an enhancement-mode HEMT. After reading this specification, skilled artisans will be able to determine the relationship between the gate electrode 156 and the opening through at least part of the dielectric layer 140 to achieve a depletion-mode or an enhancement-mode HEMT. The portions of the electrodes 152, 154, and 156 that extend beyond the openings of the dielectric layer 140 can be field plates that help to affect gate-to-drain capacitance and gate-to-source capacitance.

An interlevel dielectric (ILD) layer 160 is formed over the dielectric layer 140 and the electrodes 152, 154, and 156. The ILD layer 160 can include one or more insulating films. The ILD layer 160 is etched to define openings, and interconnects 162 and 164 are formed. Similar to the electrodes 152, 154, and 156, portions of the interconnects 162 and 164 that extend in lateral directions outside the openings can be field plates that help to affect capacitive coupling within the HEMT. The two portions of the interconnect 162 that are illustrated in FIG. 2 are connected to each other at a location not illustrated and define an opening over the gate electrode 156. The opening within the interconnect 162 helps to reduce gate-to-source capacitance. Another ILD layer 170 is formed over the ILD layer 160 and the interconnects 162 and 164. The ILD layer 170 can include one or more insulating films and can have the same composition or a different composition as compared to the ILD layer 160. The ILD layer 170 is etched to define openings, and interconnects 172 and 174 are formed. Similar to the interconnects 162, and 164, portions of the interconnects 172 and 174 that extend in lateral directions outside the openings can be field plates that help to affect capacitive coupling within the HEMT.

A passivation layer 180 overlies the ILD layer 170 and the interconnects 172 and 174. The passivation layer 180 may include a nitride or oxynitride and is a moisture barrier for the electronic device. An insulating layer 190 is formed over the passivation layer 180, and the layers 180 and 190 are etched to define an opening, and a source bond pad 192 is formed within the opening and extends over a portion of the HEMT. Other interconnects and bond pads are formed and electrically connected to the drain electrode 154 and the gate electrode 156 but are not illustrated in FIG. 2. Furthermore, a metal edge-ring seal (not illustrated) may also be used and lies adjacent to the scribe lane 108.

FIG. 3 includes a cross-sectional view of a portion of a workpiece that includes a vertical insulated-gate field-effect transistor (IGFET). In the embodiment as illustrated, the base substrate 102 can include a Group 14 element (i.e., carbon, silicon, germanium, or any combination thereof) and can be heavily n-type or p-type doped. For the purposes of this specification, heavily doped is intended to mean a peak dopant concentration of at least $1 \times 10^{18}$ atoms/cm$^3$, lightly doped is intended to mean a peak dopant concentration of less than $1 \times 10^{18}$ atoms/cm$^3$. A lightly doped semiconductor layer 103 overlies the base substrate 102. In an embodiment, the lightly doped semiconductor layer 103 can be epitaxially grown from the base substrate 102. In a particular embodiment, the lightly doped semiconductor layer 103 can have the same semiconductor material and conductivity type as the base substrate 102. The lightly-doped semiconductor layer can be a drift region for the IGFET.

Well regions 104 are formed within the semiconductor layer 103 and have a conductivity type opposite the base substrate 102. The well regions 104 are lightly doped and have a peak dopant concentration higher than the lightly doped semiconductor layer 103. A pad layer 107 overlies the well region 104 and can include an oxide, a nitride, or an oxynitride. A field isolation region 120 is formed adjacent to the pad layer 107. Doped isolation regions 123 can be formed and extend through the well regions 104 and into the base substrate 102. The doped isolation regions 123 can have a conductivity type opposite that of the base substrate 102.

Trenches are formed that extend through the pad layer 107 and the well region 104 into the lightly-doped semiconductor layer 103. A gate dielectric layer 142 and gate electrodes 144 are formed within the trenches. Source regions 163 can be formed outside and adjacent to the trenches. The source regions 163 have a conductivity type opposite that of the well regions 104. The source regions 163 are heavily doped and, in a particular embodiment, have a dopant concentration of at least $1 \times 10^{19}$ atoms/cm$^3$. The portions of the well regions 104 along the sidewalls of the trenches and between the source regions 163 and the lightly-doped semiconductor layer 103 are channel regions. The gate electrodes 144 are slightly recessed with the trenches to reduce gate-to-source capacitive coupling.

An ILD layer 200 is formed over the workpiece. The ILD layer 200 can include a single film or a plurality of films. The ILD layer 200 can include an oxide, a nitride, or an oxynitride film. In a particular embodiment, the ILD layer 200 can include a relatively thin etch-stop film, a relatively thick oxide film, and a relatively thin antireflective film. Many other variations for the ILD layer 200 are possible, and the ILD layer 200 can be tailored for a particular application.

Contact openings are formed where contacts are to be made to the source regions 163. A doping step can be performed to form doped well contact regions 304 that allow ohmic contacts to be formed to the well region 104. The source regions 163 have an opposite conductivity type as compared to the well region 104, and the doped well contact regions 304 have the same conductivity type as compared to the well region 104. Contact openings to the gate electrodes 144 may be made during the same or different patterning sequence; however, the gate electrodes 144 are not exposed during the doping operation to form the heavily doped well contact regions 304. Interconnects, such as the source interconnect 363, are formed and extend into the contact openings. The source interconnect 363 is electrically connected to the source regions 163 and the doped well contact regions 304, and a gate interconnect (not illustrated) is electrically connected to the gate electrodes 144. Back-side metal (not illustrated in FIG. 3) can be used as a drain contact that is electrically connected to the base substrate 102.

A passivation layer 380 overlies the ILD layer 200 and the source electrode 363. The passivation layer 380 can include a nitride or oxynitride and is a moisture barrier for the electronic device. The passivation layer 380 is etched to define openings, and a source bond pad 393 and a gate bond pad (not illustrated) are formed within the openings and extend over a portion of the IGFET. The source bond pad 393 contacts the source interconnect 363, and the gate bond pad contacts the gate interconnect. The features illustrated are within the component region 106. Scribe lanes 108 (not illustrated in FIG. 3) can surround the electronic device that include the features in FIG. 3. Back-side metal (not illustrated in FIG. 3) can be used at a drain contact that is electrically connected to the base substrate 102. In the finished device, current can flow from the base substrate 102, through the semiconductor layer 103, the well region 104, the source regions 163, and the source interconnect 363, to the source bond pad 393. Hence, each of such features are current-carrying features within the electronic device.

FIGS. 2 and 3 illustrate particular embodiments and are used to demonstrate that a wide variety of different electronic devices may be used. Although not required, electronic devices that are used in applications involving high voltage (for example, at least 50 V), high current (for example, at least 1 A), or high power (for example, at least 1 W) may be well suited for the concepts are described herein. During subsequent processing as described in more detail below, all or nearly all of the base substrate 102 is subsequently removed from under the plurality of layers that overlies the base substrate 102. The thickness of the base substrate 102, if present in a finished device, is substantially thinner than the thickness of a wafer after performing a conventional backgrinding operation for example, in a range of 75 microns to 200 microns before the wafer is singulated into dies.

Processes of forming electronic devices and the resulting electron devices have been developed that can allow all or nearly all the thickness of a base substrate to be removed from component regions of electronic devices before the electronic devices are separating into individual dies. The thickness of the plurality of layers, and if present, a remaining portion of the base substrate 102, may be thinner than a substrate after conventional backgrinding operation, for example, less than 75 microns. In an embodiment, the thickness of the plurality of layers may be at most 9 microns when using the processes as described in more detail below. Skilled artisans may refer to the processing as wafer-level processing, as opposed to die-level processing. Accordingly, the base substrate 102 can have a dimension along the major surface of at least 100 mm. The dimension may be a width or a length. In an embodiment, the dimension is a width, and the width can include either dimension of a square, the smaller of the two dimensions of a non-equilateral rectangle, a diameter of a circle, a minor axis of an ellipse, and the like. Other sizes of the base substrate 102 were previously described.

Figure 4:
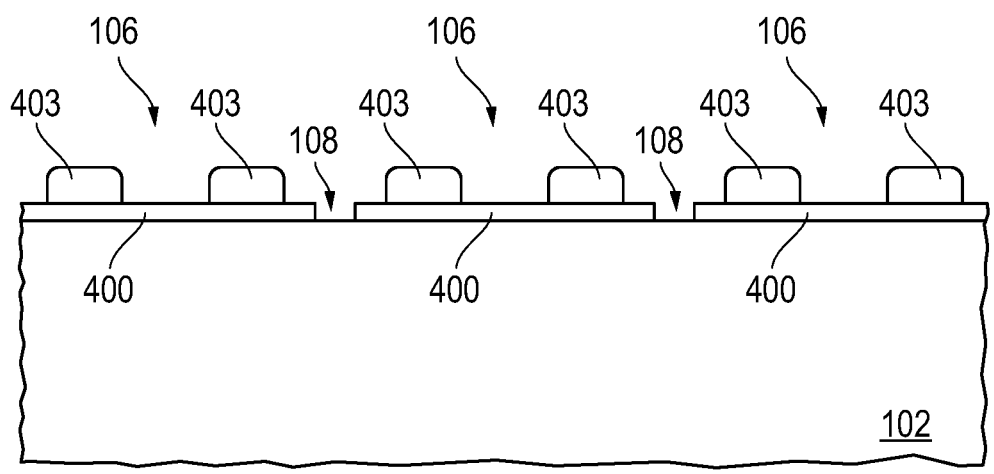
FIG. 4 includes an illustration of a cross-sectional view of a portion of the workpiece of FIG. 1 that includes a base substrate, a plurality of layers, and spacer structures.

FIG. 4 includes the base substrate 102, a plurality of layers 400 within the component regions 106, the scribe lanes 108, and spacer structures 403. The plurality of layers 400 corresponds to the layers formed over the base substrate 102, such those illustrated in FIGS. 2 and 3 including layers used to form features, such as an electronic device or component, electrodes and interconnects. One or more of the plurality of layers 400 may be removed along the scribe lanes 108 as illustrated in FIG. 4, or one or more of the plurality of layers 400 may be continuous between two component regions 106 and extend across a scribe lane 108.

The spacer structures 403 can help to determine an endpoint when a subsequently-formed polymer support layer is thinned. The spacer structures 403 are not required in all embodiments, and the spacer structures 403 may be omitted for some embodiments.

Before addressing details regarding the spacer structures 403, recommended minimum thicknesses for the polymer support layer for different sizes of the base substrate 102 are provided in Table 1. However, depending upon the intrinsic stress of the plurality of layers 400 that overlies the base substrate 102, a thicker or thinner polymer support layers may be used. In an embodiment, the thickness of the polymer support layer is measured over the plurality of layers 400.

TABLE 1

| Base Substrate Widths and Polymer Support Layer Thicknesses | | | | | |
|---|---|---|---|---|---|
| Base substrate width (mm) | 100 | 150 | 200 | 300 | 400 |
| Polymer support layer thickness (microns) | 30 | 40 | 50 | 75 | 100 |

The height of the spacer structures 403 may be at least the same as the recommended thickness of the polymer support layer for a particular width of the base substrate 102. In another embodiment, the height of the spacer structures 403 can be at least 1.2 times or at least 1.5 times the recommended minimum thickness for a particular width of the base substrate 102. Although a theoretical upper limit for the height of the spacer structures 403 is unknown, process or device complications may arise when the height of the spacer structures 403 is too great. In another embodiment, the height of the spacer structures 403 can be at most 5 times, at most 4 times, or at most 3 times the recommended minimum thickness for a particular width of the base substrate 102. In a further embodiment, ball drop spheres may be used for the spacer structures 403 and may be as large as 1 mm or 25 times the recommended minimum thickness.

The spacer structures 403 can include a material different from the subsequently-formed polymer support layer. The spacer structures 403 can include a metal-containing material; an inorganic oxide, nitride, or oxynitride; a different polymer as compared to the polymer support layer, or an additive to aid in endpoint detection (when the spacer structures 403 and the polymer support layer include the same base polymer material).

In an embodiment, the spacer structures 403 can be electrically conductive members and may be a metal or metal alloy. The spacer structures 403 can be plated as electrically conductive bumps that are electrically connected to underlying bond pads, interconnects, or the like within the plurality of layers 400. In another embodiment, electrically conductive solder balls can be placed over exposed bond pads, interconnects, or the like. In a further embodiment, the spacer structures 403 can be electrically insulating and lie within the scribe lanes 108. In a particular embodiment, an insulating material can be formed within the scribe lanes 108. One or more stencil masks can be used to form the insulating material within the scribe lanes 108 without significantly affecting the electrical connections that have or will be formed to the bond pads, interconnects, or the like within the component regions 106. In yet a further embodiment, the spacer structures 403 can be in the form of a solid lattice that is positioned so that it is aligned to the scribe lanes 108. A relatively thin adhesion layer may be used if needed or desired to keep the solid lattice from moving when the polymer support layer is subsequently formed over the base substrate 102.

The amount of area covered by the spacer structures 403 may depend on the location of the spacer structure 403 and the underlying device design. When the spacer structures 403 are formed within the scribe lanes 108 and do not extend or extend only an insignificant distance into the component regions 106, the spacer structures 403 may cover at most 30% of the area along the front-side major surface of the base substrate 102.

When the spacer structures 403 are electrically conductive, the spacer structures may cover at most 95% of each component region 106. Such a high level of coverage may occur in power electronic devices that have only a few (for example, no greater than five) electrical connections between the electronic device and an external electrical component (for example, a circuit board, lead frame, interposer, or the like). When the electronic device has more external electrical connections, the amount of the component regions covered by the spacer structures 403 may be lower. A microprocessor, a microcontroller, or a memory may have substantially more terminals than a power device. Each of the spacer structures 403 may be smaller, and the cumulative area occupied by the spacer structures 403 for the microprocessor, microcontroller, or memory may be less than 50% of the area of the component regions 106. In a particular embodiment, the spacer structures 403 may occupy at least 25% of the area of the component regions 106. In another embodiment, a different electronic device may have a number of terminals between that of a power device and that of a microprocessor, microcontroller, or memory. The area occupied by the spacer structures 403 may be at least 5% of the area of the component regions 106. In a particular embodiment, the spacer structures 403 can occupy an area in a range from 11% to 30% of the component region 106.

Figure 5:
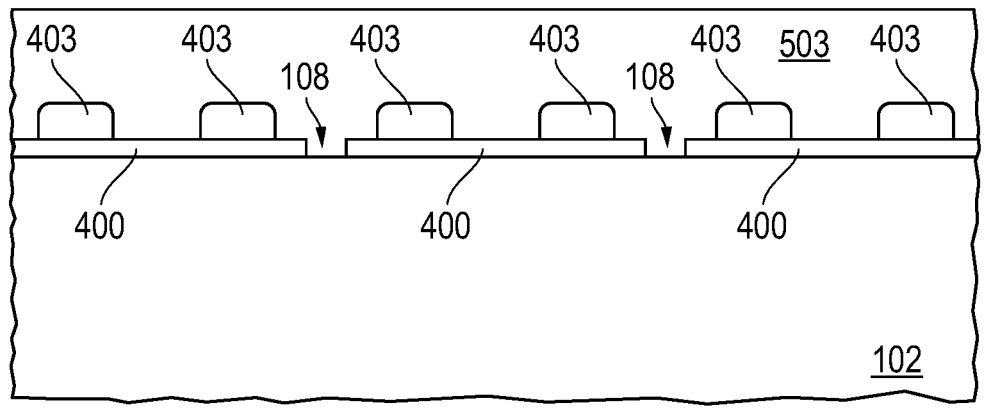
FIG. 5 includes an illustration of a cross-sectional view of the workpiece of FIG. 4 after forming a front-side polymer support layer.

In FIG. 5, a front-side polymer support layer 503 can be formed over the base substrate 102, plurality of layers 400, and spacer structures 403. The polymer support layer 503 by itself or in combination with the spacer structures 403 provides sufficient mechanical support when all or nearly all of the base substrate 102 is subsequently removed. Recommended minimum thicknesses for the polymer support layer 503 for a particular size of base substrate 102 are provided in Table 1 as previously described. Although a theoretical upper limit on the thickness of the polymer support layer 503 is unknown, a practical upper limit may be used so that processing is not unnecessarily complicated or extra material is not wasted. In an embodiment, the polymer support layer 503 may be at most 500 microns, and in many embodiments, a thickness of at most 300 microns can provide sufficient mechanical support. In other embodiments, the thickness can be at least 50 microns or at least 75 microns.

The polymer support layer 503 can be formed by compression molding, coating, rolling, or otherwise depositing a polymer precursor and curing the polymer precursor to form the polymer support layer 503. Curing can be performed thermally or by other means, such as a chemical hardener or exposure to radiation, such as ultraviolet radiation or infrared radiation, and may be performed at atmospheric pressure or higher pressure. In a particular embodiment, the polymer precursor can be an overmolding compound used in packaging semiconductor devices. The polymer precursor can be an epoxy resin cured using heat and pressure higher than atmospheric pressure.

Different process flows may be used at this time in the process depending on the needs or desires for a particular application. In one set of embodiments, the base substrate 102 is removed before removing the polymer support layer 503. In another set of embodiments, a portion of the polymer support layer 503 is removed before removing the base substrate 102. The description below addresses embodiments where the base substrate 102 is removed relatively earlier in the process sequence before addressing embodiments where the base substrate 102 is removed relatively later in the process sequence.

Subsequent processing may or may not involve attaching the workpiece to a temporary support. The temporary support can include a tape substrate and a pressure sensitive adhesive, a glass carrier with adhesive, an electrostatic chuck, and the like. In the case of a tape, the materials for the tape substrate and pressure sensitive adhesive may depend on the particular application. For example, a grinding operation or a thermal curing operation may be performed when the workpiece is attached to a high-temperature tape. The tape substrate may include a polyimide or another material that can withstand a temperature of at least 200° C., and the pressure sensitive adhesive may include a silicone or an acrylic material. If the tape is not exposed to a high temperature, a wider variety of tape substrates and pressure sensitive adhesives can be used. The tape substrate can include polyvinyl chloride, polyethylene terephthalate, polyolefin, and the pressure sensitive adhesive can include polyisobutylene, polyvinyl alcohol, or the like. Commercially available dicing tape may be used. Kapton™-brand tapes include a variety of tapes for different purposes. After reading this specification, skilled artisans will be able to determine whether tape or other temporary support is or is not used, and when used, the materials for the tape substrate and pressure sensitive adhesive.

Figure 6:
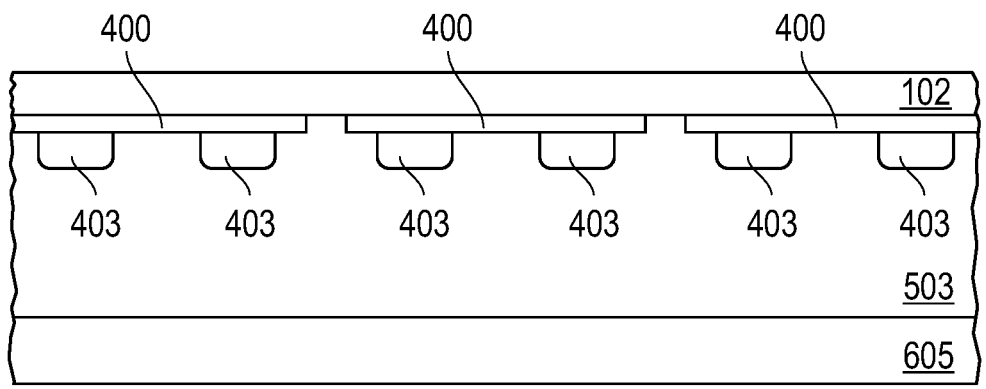
FIG. 6 includes an illustration of a cross-sectional view of the workpiece of FIG. 5 after removing a portion of the base substrate.

Referring to FIG. 6, the polymer support layer 503 is attached to a tape 605. Before removing any portion of the base substrate 102 along the back-side major surface of the workpiece, the base substrate 102 can have a thickness in a range of 500 microns to 900 microns. In an embodiment, the first portion of the removal can be performed using a backgrinding operation. The backgrinding operation can be a standard grind or in some cases a Taiko grind. The first portion of removing the base substrate 102 can reduce the thickness of the base substrate 102, so that the thickness is in a range of approximately 20 microns to 200 microns. The front-side polymer support layer 503 allows the thickness of the base substrate 102 to be thinner as compared to using a conventional backgrinding operation in the absence of the polymer support layer 503.

Figure 7:
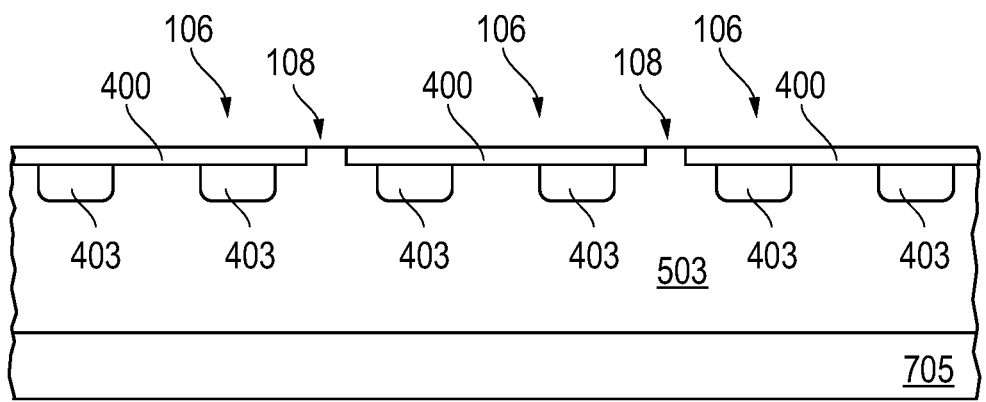
FIG. 7 includes an illustration of a cross-sectional view of the workpiece of FIG. 6 after removing a remaining portion of the base substrate.

After backgrinding, the workpiece can be transferred to or mounted onto another tape 705, if needed or desired. In FIG. 7, the remaining portion of the base substrate 102 can be removed using a dry or wet stripping technique that is selective to a layer within the plurality of layers 400. The removal of the remaining portion of the base substrate 102 can be performed using endpoint detection, a timed etch, or a combination of endpoint detection and a timed overetch.

Figure 8:
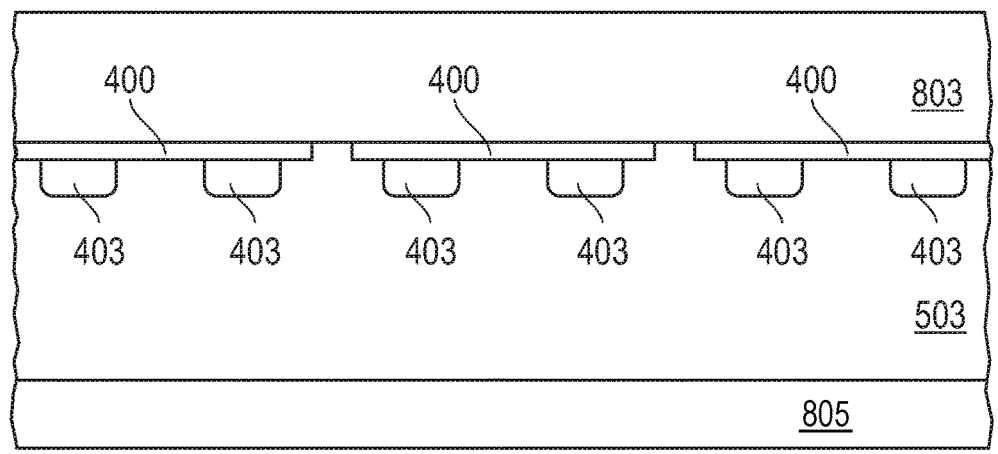
FIG. 8 includes an illustration of a cross-sectional view of the workpiece of FIG. 7 after forming a back-side polymer support layer.

After removing the base substrate 102, the workpiece can be transferred to another tape 805, if needed or desired, as illustrated in FIG. 8. A back-side polymer support layer 803 is formed along the portion of the workpiece where the base substrate 102 has been removed. The polymer support layer 803 can be formed using any of the materials, thicknesses, and formation techniques as previously described with respect to the front-side polymer support layer 503. The polymer support layer 803 can have the same composition or a different composition as compared to the polymer support layer 503. The polymer support layer 803 can have the same thickness or a different thickness as compared to the polymer support layer 503. The polymer support layer 803 can be formed using the same formation technique or a different formation technique as compared to the polymer support layer 503.

Figure 9:
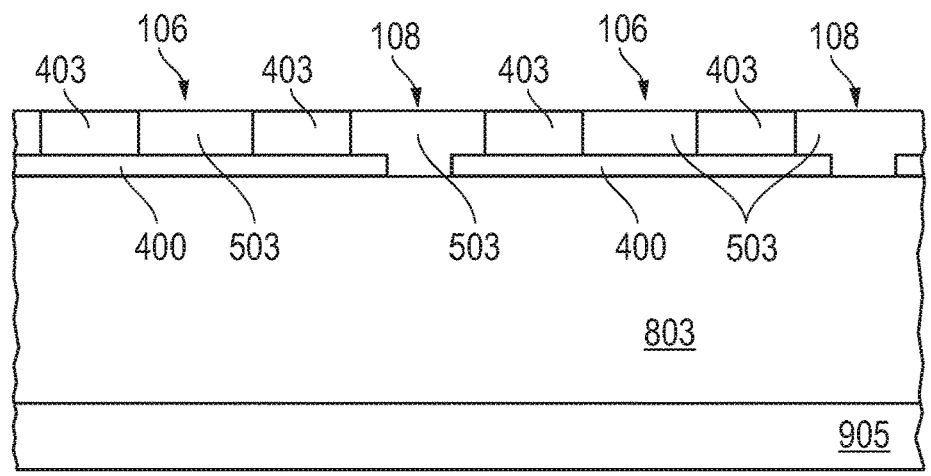
FIG. 9 includes an illustration of a cross-sectional view of the workpiece of FIG. 8 after removing a portion of the front-side polymer support layer to expose the spacer structures.

Referring to FIG. 9, the workpiece is turned over, and the polymer support layer 803 is attached to a tape 905. A portion of the front-side polymer layer 503 is removed to reduce the thickness of the polymer support layer 503. In an embodiment, a grinding is performed to remove the polymer support layer 503 until the spacer structures 403 are exposed. The spacer structures 403, whether within the component regions 106 (FIG. 9) or the scribe lanes 108, can assist with endpoint detection of the front grinding operation. In a particular embodiment, a commercially-available surface planer used in the semiconductor industry may be equipped with a diamond bit for the grinding operation. If needed or desired, a portion of the polymer support layer 503 is removed by other means, such as by chemical etching, to allow the spacer structures 403 to be raised. Such a configuration for the die may be desired when used in a flip-chip package.

Figure 10:
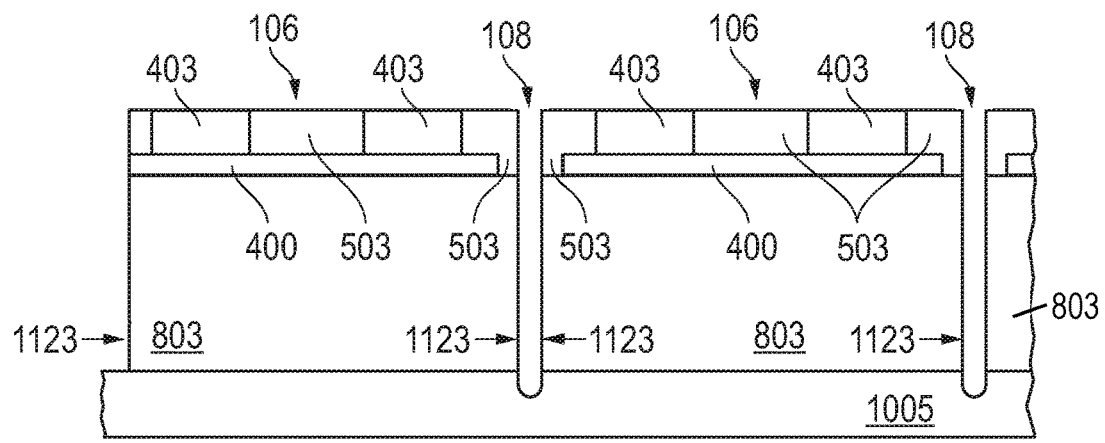
FIG. 10 includes an illustration of a cross-sectional view of the workpiece of FIG. 9 after singulating the workpiece into dies.

If needed or desired, the workpiece can be transferred to another tape 1005, as illustrated in FIG. 10. The back-side polymer support layer 803 is attached to the tape 1005. The workpiece can be singulated along the scribe lanes 108 to provide dies that each include a component region 106, as illustrated in FIG. 10.

Figure 11:
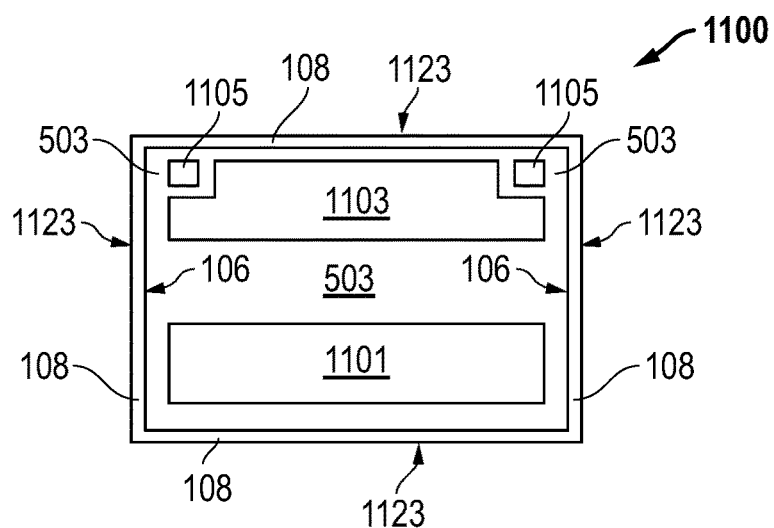
FIG. 11 includes an illustration of a top view of a die after singulating the workpiece.

FIG. 11 includes a top view of a die 1100 after singulation. A drain terminal 1101, a source terminal 1103, and gate terminals 1105 are specific types of spacer structures 403 and are within one of the component regions 106. The other component regions 106 can have terminals that are identical or different as compared to the terminals 1101, 1103, and 1105. A remaining portion of the polymer support layer 503 lies along the exposed surface and laterally surrounds the terminals 1101, 1103, and 1105. Each of the dies has peripheral sides 1123. At least one peripheral side of the polymer support layer 503 and at least one peripheral side of the polymer support layer 803 are substantially coterminous. In FIGS. 10 and 11, all peripheral sides of the polymer support layer 503 and all peripheral sides of the polymer support layer 803 are substantially coterminous. The remaining portions of the polymer support layers 503 and 803 are examples of front-side and back-side members, respectively. The die 1100, corresponding to one of the component regions 106, can be attached to a packaging substrate, an interposer, or a lead frame and further processed.

Figure 12:
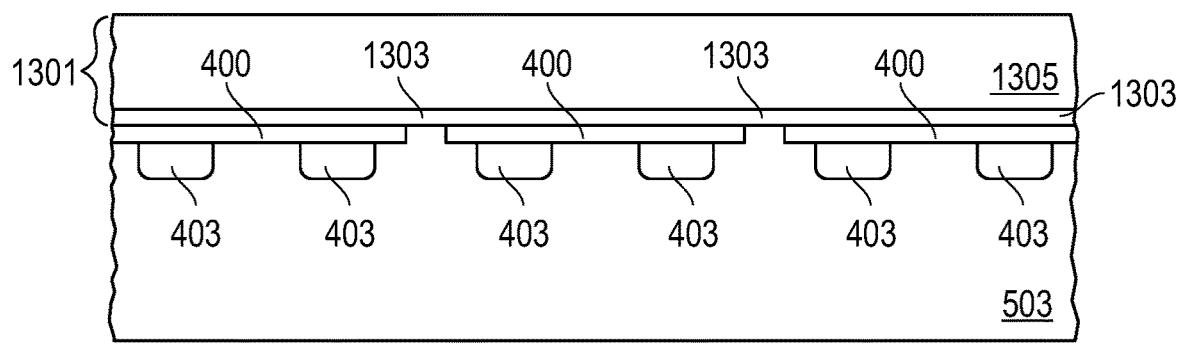
FIG. 12 includes an illustration of a cross-sectional view of the workpiece of FIG. 7 after forming an electrically insulting, thermally conductive layer and attaching a heat sink structure along the back major surface of the workpiece in accordance with another embodiment.

In another embodiment illustrated in FIG. 12, a heat sink module 1301 may be used along the back-side major surface of the workpiece. The process for the heat sink module 1301 may start after the base substrate 102 is removed, as illustrated in FIG. 7. In FIG. 12, a heat sink module 1301 can includes a heat sink layer 1303 and a heat sink structure 1305, both of which are thermally conductive. In an embodiment, the heat sink structure 1305 can be electrically conductive, and the heat sink layer 1303 is electrically insulating. The heat sink layer 1303 can include AN and be formed by a physical vapor deposition, an aerosol deposition, or the like. The heat sink layer 1303 can have a thickness sufficient to electrically insulate the heat sink structure 1305 from the plurality of layers. In a particular embodiment, the heat sink structure 1305 can be attached to the heat sink layer 1303 with a thermally conductive epoxy resin (not illustrated).

In another set of embodiments, the front-side polymer support layer 503 can be thinned before thinning the base substrate 102. The spacer structures 403 and the polymer support layer 503 can be formed along the front-side major surface of the workpiece as previously described and illustrated with respect to FIGS. 4 and 5. The base substrate 102 can be attached to a tape or other temporary support structure. The polymer support layer 503 can be removed until the spacer structures 403 are exposed, as previously described with respect to FIG. 9.

Figure 13:
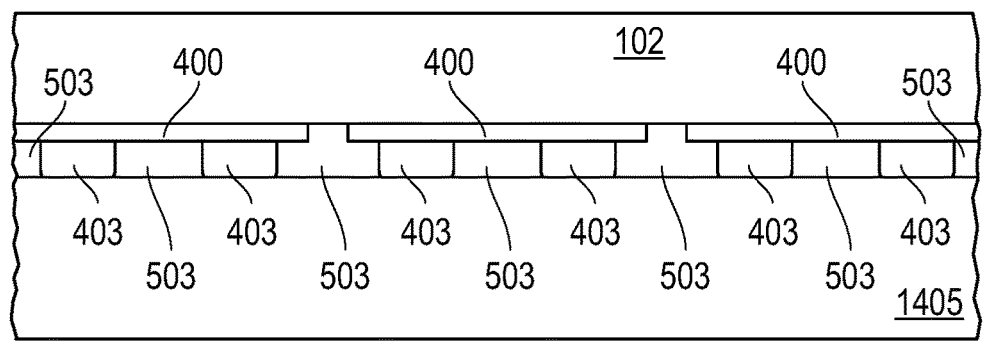
FIG. 13 includes an illustration of a cross-sectional view of the workpiece of FIG. 5 after removing a portion of the front-side polymer support layer to expose the spacer structures and removing a portion of the base substrate along the back major surface of the workpiece.

The workpiece is turned over, and the spacer structures 403 and the polymer support layer 503 are attached to a tape or other temporary support structure 1405, as illustrated in FIG. 13. Before thinning, the base substrate 102 can have a thickness in a range of 500 microns to 900 microns. A removal process is performed to remove most of the base substrate 102. The removal process can be any of the removal processes as previously described and illustrated with respect to FIG. 6. After the removal process, the thickness of the base substrate 102 is in a range of 50 microns to 200 microns.

Figure 14:
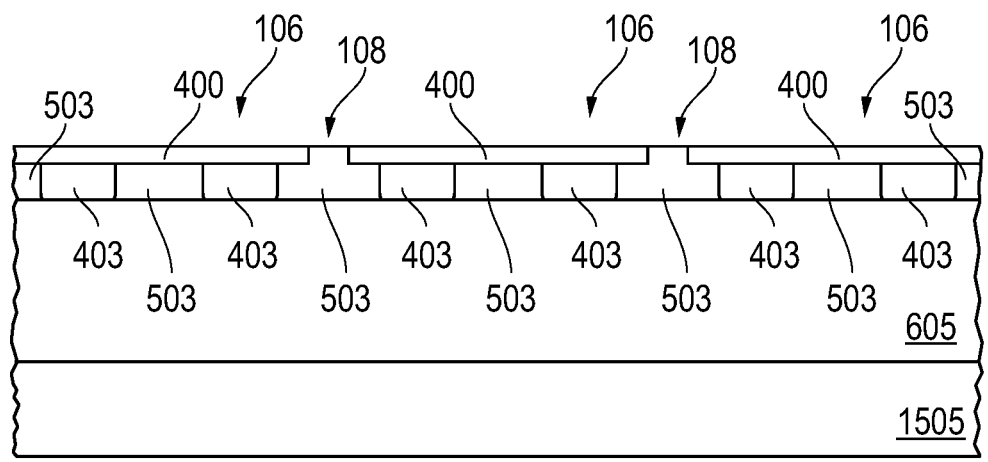
FIG. 14 includes an illustration of a cross-sectional view of the workpiece of FIG. 13 after removing a remaining portion of the base substrate.

After thinning, the workpiece and the tape or other temporary support structure 1405 are optionally attached to a tape 1505, as illustrated in FIG. 14. The additional tape 1505 may provide additional mechanical support. The remaining portion of the base substrate 102 can be removed as previously described and illustrated with respect to FIG. 7.

Figure 15:
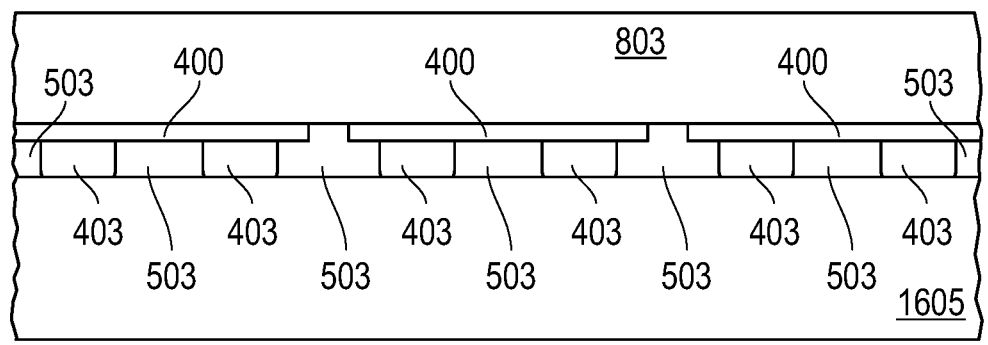
FIG. 15 includes an illustration of a cross-sectional view of the workpiece of FIG. 14 after forming a back-side polymer support layer.

The back-side polymer support layer 803 can formed along the portion of the workpiece where the base substrate 102 has been removed, as illustrated in FIG. 15. The workpiece can be turned over, and the polymer support layer 803 can be attached to a tape 1605. The workpiece can be singulated to provide dies, as previously described and illustrated with respect to FIG. 10. At least one of the dies can be substantially identical to the die illustrated in FIG. 11.

Figure 16:
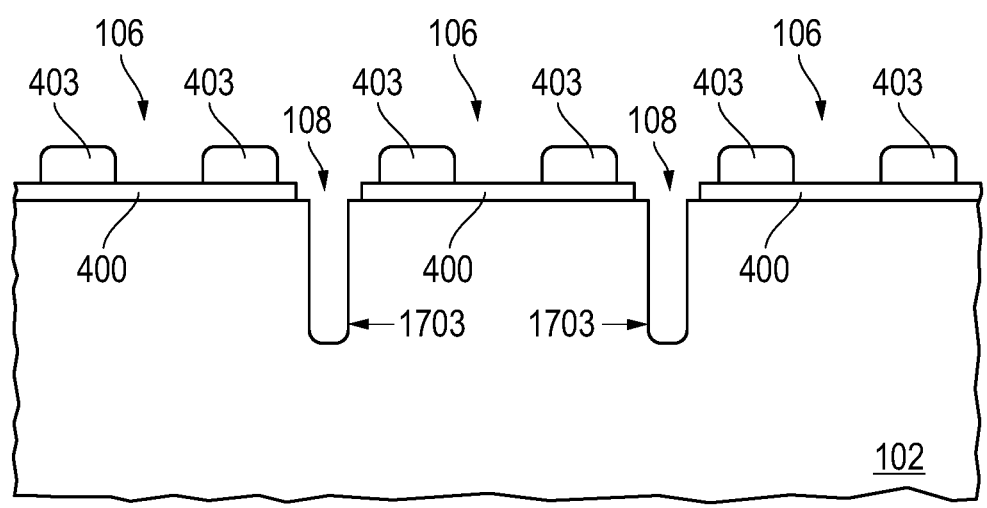
FIG. 16 includes an illustration of a cross-sectional view of the workpiece of FIG. 4 after removing a portion of the base substrate within the scribe lanes.

In another set of embodiments, structural support can be provided within the scribe lanes 108 and outside the component regions 106. A workpiece can be processed as previously described with respect to FIG. 4. Referring to FIG. 16, an etch, a saw, a laser jet, or the like can remove portions of the base substrate 102 to define trenches 1703 within the scribe lanes 108. The depths of the trenches 1703 can correspond to a thickness of a subsequently-formed polymer support layer along the front-side major surface of the workpiece. In an embodiment, the depths of the trenches 1703 can have depths corresponding to the previously-described thicknesses of the polymer support layer 503. In an embodiment, the trenches 1703 can have a depth in a range from 50 microns to 200 microns.

Figure 17:
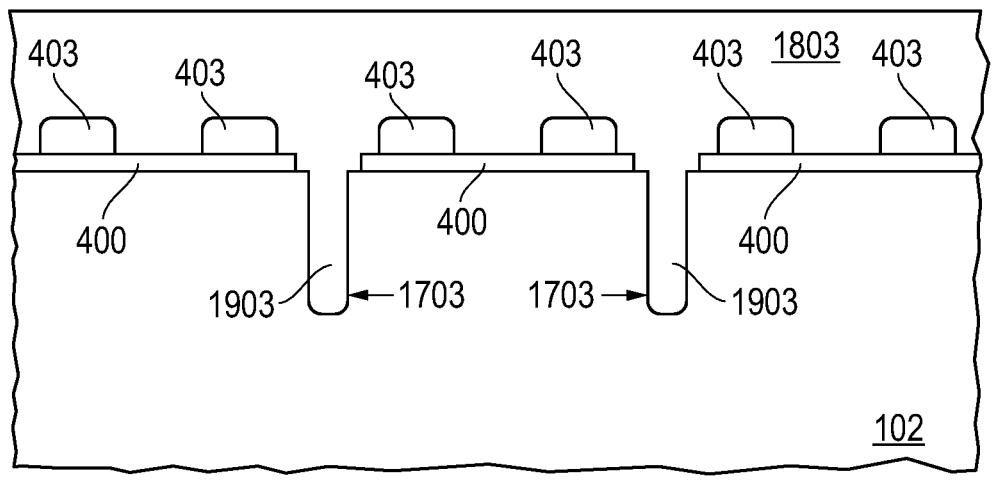
FIG. 17 includes an illustration of a cross-sectional view of the workpiece of FIG. 16 after forming a front-side polymer support layer.
Figure 18:
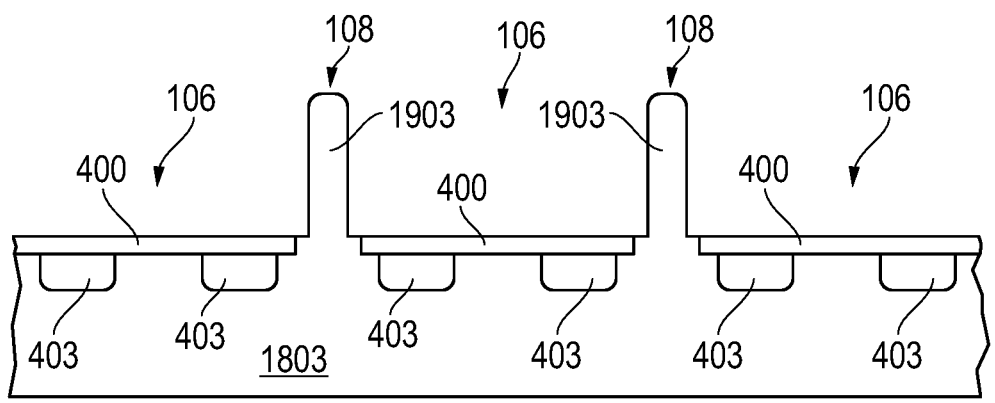
FIG. 18 includes an illustration of a cross-sectional view of the workpiece of FIG. 17 after removing the base substrate.

Referring to FIGS. 17 and 18, a front-side polymer support layer 1803 is formed over the plurality of layers 400, the spacer structures 403, and within the trenches 1703. The polymer support layer 1803 can include any of the materials and be formed using the processing techniques as described with respect to the polymer support layer 503. As measured over the plurality of layers 400, the polymer support layer 1803 can be relatively thinner as compared to the polymer support layer 503 because the portions 1903 of the polymer support layer 1803 within the trenches 1703 provide sufficient mechanical support.

The workpiece can be turned over, and the polymer support layer 1803 can be attached to a tape or other temporary support (not illustrated). Portions of the base substrate 102 can be removed in a manner similar to the process previously described and illustrated with respect to FIGS. 6 and 7 to produce the workpiece as illustrated in FIG. 18. The plurality of layers 400 is exposed within the component regions 106. In an embodiment, the backgrinding operation may use portions 1903 of the polymer support layer 1803 for endpoint detection or to control the depth and across wafer uniformity of the grind by acting as a grind stop layer. After grind, the base substrate 102 between the portions 1903 of the polymer support layer 1803 are selectively removed by using an etch process. The portions 1903 of polymer support layer 1803 that were previously within the trenches 1703 are now exposed. The portions 1903 can be in a form of a lattice along the scribe lanes 108 and between the component regions 106.

Figure 19:
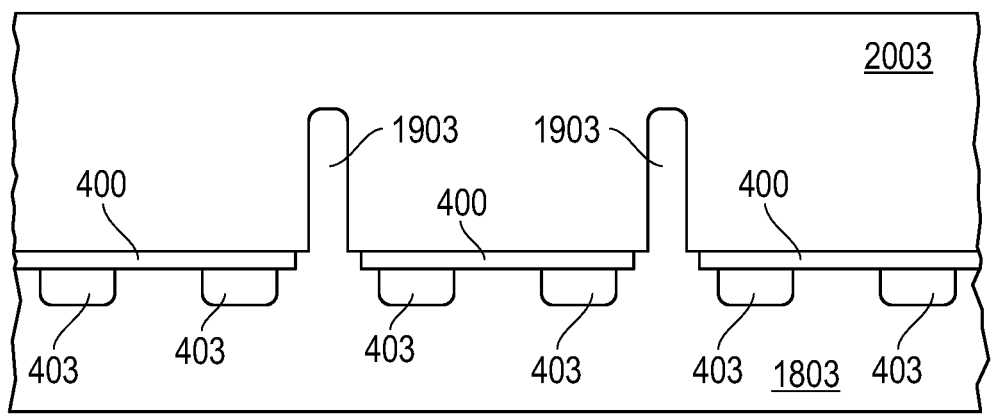
FIG. 19 includes an illustration of a cross-sectional view of the workpiece of FIG. 18 after forming a back-side polymer support layer.

A back-side polymer support layer 2003 is formed over the plurality of layers 400 and the portions 1903, as illustrated in FIG. 19. The polymer support layer 2003 can include any of the materials and thicknesses (as measured over the plurality of layers 400) and be formed using the processing techniques as described with respect to the polymer support layer 1803. In an embodiment, the polymer support layer 2003 can include the same material or a different material as compared to the polymer support layer 1803, the polymer support layer 2003 can have the same thickness or a different thickness as compared to the polymer support layer 1803, and the polymer support layer 2003 can be formed using the same processing technique or a different processing technique as compared to the polymer support layer 1803.

The workpiece can be turned over, and the polymer support layer 2003 can be attached to a tape. The polymer support layer 1803 can be thinned to expose the spacer structures 403 using a process as described and illustrated with respect to FIG. 9. Processing can continue as illustrated and described in FIG. 10 to provide a singulated die.

Figure 20:
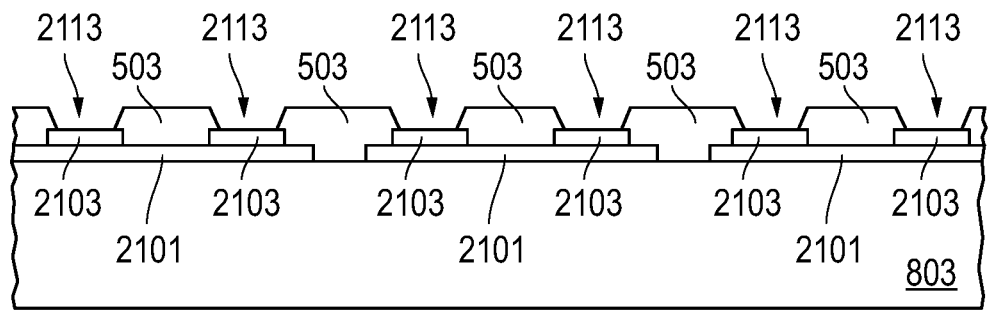
FIG. 20 includes an illustration of a cross-sectional view of the workpiece of FIG. 19 after portions of the front-side polymer support layer are removed to expose bond pads.

In another embodiment, spacer structures may not be used. Bond pads can be part of the plurality of layers 400, although the bond pads may be illustrated separately from the plurality of layers to illustrate better the process. Thus, the plurality of layers 400 can be a combination of bond pads 2103 and remaining layers 2101, as illustrated in FIG. 20. The bond pads 2103 are substantially thinner than the spacer structures 403. In an embodiment, the bond pads 2103 have a thickness of at least 0.2 micron, and in another embodiment, the bond pads 2103 have a thickness of at most 5 microns. The formation of polymer support layers 503 and 803 and removal of the base substrate 102 can be performed as previously described and illustrated with respect to FIGS. 5 to 8. A portion of the polymer support layer 503 can be removed. Unlike the process as described and illustrated with respect to FIG. 9, the removal of the polymer support layer 503 may not be performed with endpoint detection. The removal may be timed or monitored using a capacitance between the bond pads 2103 and measurement probes or monitoring another electronic parameter. The removal can be performed using front grinding. After a desired thickness of the polymer support layer 503 is removed, the remaining polymer support layer 503 can have a thickness (as measured over the plurality of layers 400) that is the same or thinner than previously described with respect to the process as illustrated in FIG. 9. In the embodiment as illustrated in FIG. 20, the remaining portion of the polymer support layer 503 can have a thickness of at least 1 micron or at least 10 microns.

Portions of the remaining polymer support layer 503 overlying the bond pads 2103 can be selectively removed to define openings 2113 and expose the bond pads 2103. In an embodiment, an excimer laser can be used to ablate the polymer support layer 503 overlying the bond pads 2103. In a particular embodiment, large-area ablation may be achieved using a stencil mask between an energy source and the workpiece. Singulation of the workpiece and subsequent processing can be performed as previously described.

The processes can be modified so that they are well suited for applications that have a back-side major surface contact to the plurality of layers or a remaining portion of a base substrate. In the embodiments described below, more details regarding the plurality of layers are seen.

In a set of embodiments, some of the base substrate 102 may be retained in the finished device. The plurality of layers 400 includes a device section and an interconnect section. In a particular embodiment, the device section can include a doped Si layer, an epitaxial layer, a well region, and electronic components within the epitaxial layer or well region. The interconnect section can include one or more interlevel levels that can each include an interlevel dielectric layer and an electrically conductive layer.

Figure 21:
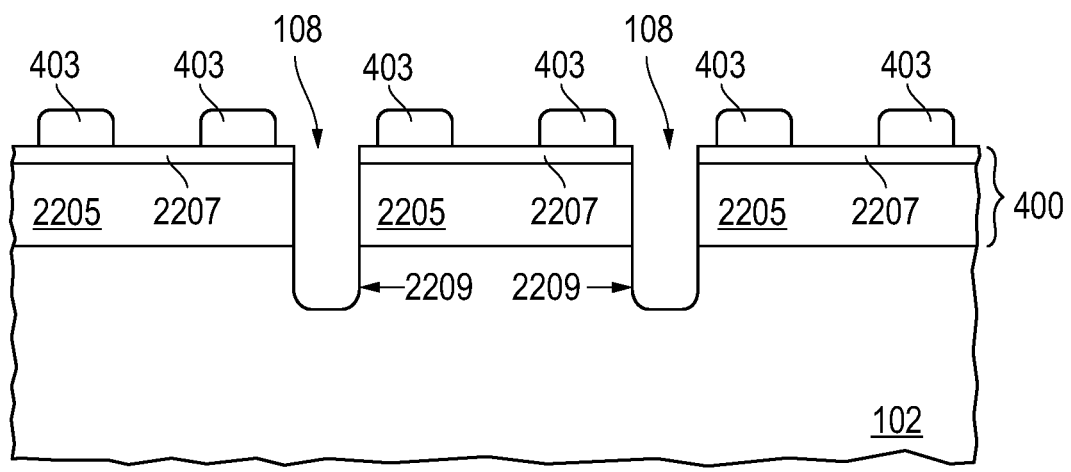
FIG. 21 includes an illustration of a cross-sectional view of the workpiece of FIG. 4 after removing portions of the plurality of layers and the base substrate within the scribe lanes.

In a particular set of embodiments, some of the base substrate 102 remains in a finished electronic device. FIG. 21 includes a cross-sectional view after forming the spacer structures 403. Spacer structures 403 are formed using a technique as previously described with respect to FIG. 4. The plurality of layers 400 includes a device section 2205 and an interconnect section 2207. In a particular embodiment, the device section 2205 can include an epitaxial layer, a well region, and electronic components within the epitaxial layer or well region. The interconnect section 2207 can include one or more interlevel levels that can each include an interlevel dielectric layer and an electrically conductive layer. Portions of the plurality of layers 400 can be removed to define trenches 2209 within the scribe lanes 108 to expose portions of the base substrate 102 within the scribe lanes 108. The trenches 2209 can be formed using any of the techniques as previously described with respect to the trenches 1703 as described and illustrated with respect to FIG. 16.

Figure 22:
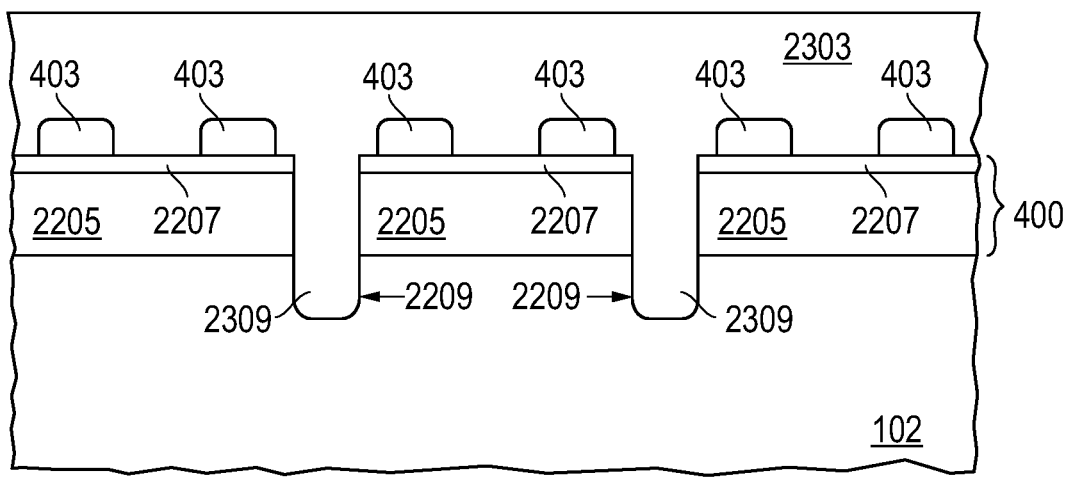
FIG. 22 includes an illustration of a cross-sectional view of the workpiece of FIG. 21 after forming a front-side polymer support layer.

A front-side polymer support layer 2303 is formed over spacer structures 403, the plurality of layers 400 and within the trenches 2209, as illustrated in FIG. 22. The polymer support layer 2303 includes portions 2309 that lie within the scribe lanes 108. The polymer support layer 2303 can include any of the materials, have any of the thicknesses, and be formed using any of the techniques as previously described with respect to the polymer support layer 1803 in FIG. 17.

Figure 23:
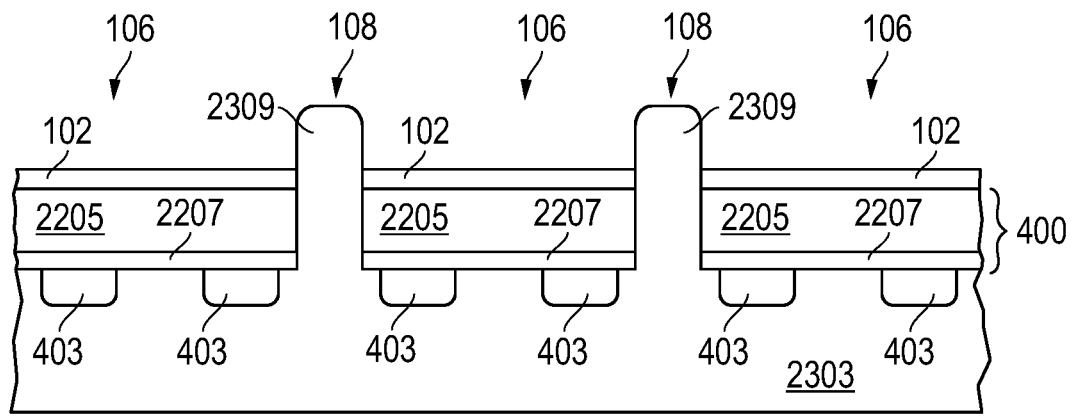
FIG. 23 includes an illustration of a cross-sectional view of the workpiece of FIG. 22 after removing the base substrate.

The workpiece is turned over, and a portion of the base substrate 102 is removed, as illustrated in FIG. 23. Removal of the base substrate 102 can be performed using any of the techniques as previously described with respect to FIGS. 6 and 7; however, not all of the base substrate 102 is removed. After backgrinding is performed (see FIG. 6), an etch can be performed to remove some, but not all, of the base substrate 102. In an embodiment, the etch can be performed with endpoint detection to signal when the portions 2309 of the polymer support layer 2303 are exposed, and a timed overetch may be performed to recess the base substrate 102 between raised portions 2309 of the polymer support layer 2303. The raised portions 2309 of the polymer support layer 2303 can help to improve stability of the workpiece. The recessed portions of the base substrate 102 within the component regions 106 may simplify subsequent processing.

Figure 24:
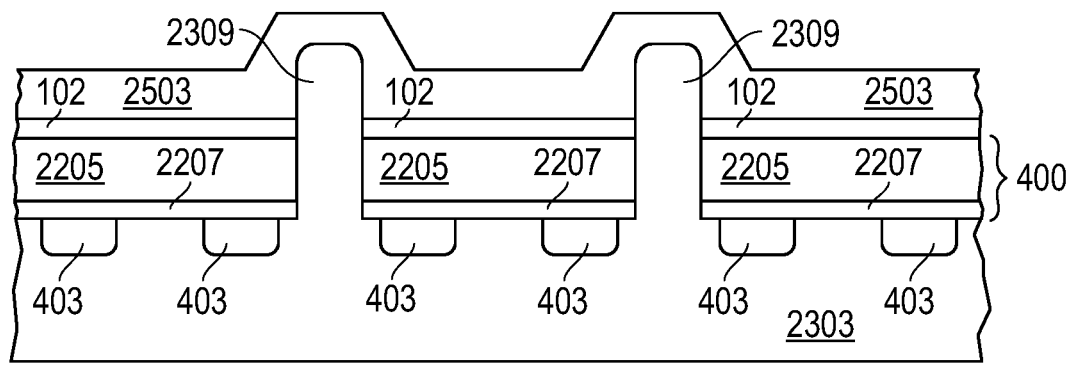
FIG. 24 includes an illustration of a cross-sectional view of the workpiece of FIG. 23 after forming an electrically conductive layer along the back side of the workpiece.

An electrically conductive layer 2503 can be formed over portions of the remaining plurality of layers 400 and the polymer support layer 2303, as illustrated in FIG. 24. The electrically conductive layer 2503 can be electrically conductive and include a metal or metal alloy. The electrically conductive layer 2503 can include Ni, Au, Cu, Al or the like and be plated or deposited by physical vapor deposition.

Figure 25:
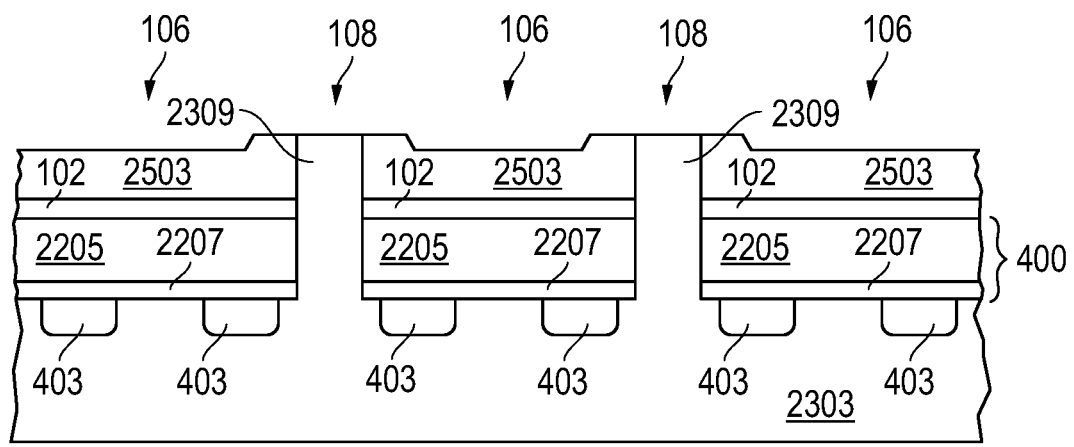
FIG. 25 includes an illustration of a cross-sectional view of the workpiece of FIG. 24 after removing portions of the electrically conductive layer within the scribe lanes.

FIG. 25 illustrates the workpiece after portions of the electrically conductive layer 2503 overlying the raised portions 2309 of the polymer support layer 2303 are removed. Some of the raised portions 2309 of the polymer support layer 2303 can also be removed. The removal can be performed using a grinding, planning, or polishing technique. In the embodiment as illustrated, little or none of the electrically conductive layer 2503 within the recession defined by the raised portions 2309 of the polymer support layer 2303 is removed.

Figure 26:
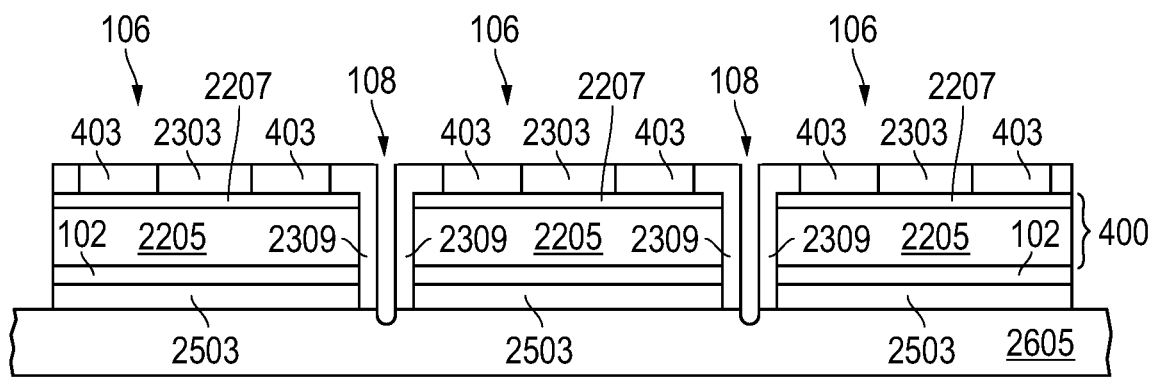
FIG. 26 includes an illustration of a cross-sectional view of the workpiece of FIG. 25 after singulating the workpiece into dies.

The workpiece can be turned over and attached to a tape 2605 to continue with front-side processing as illustrated in FIG. 26. A portion of the polymer support layer 2303 can be removed to expose the spacer structures 403, and the workpiece can singulated along the scribe lanes 108 to form dies that include the component regions 106. The processing operations as previously described with respect to FIG. 10 can be used. In another embodiment, spacer structures 403 may not be used. Bond pads 2103 and a laser ablation operation, such as described with respect to FIG. 20, may be used.

Figure 27:
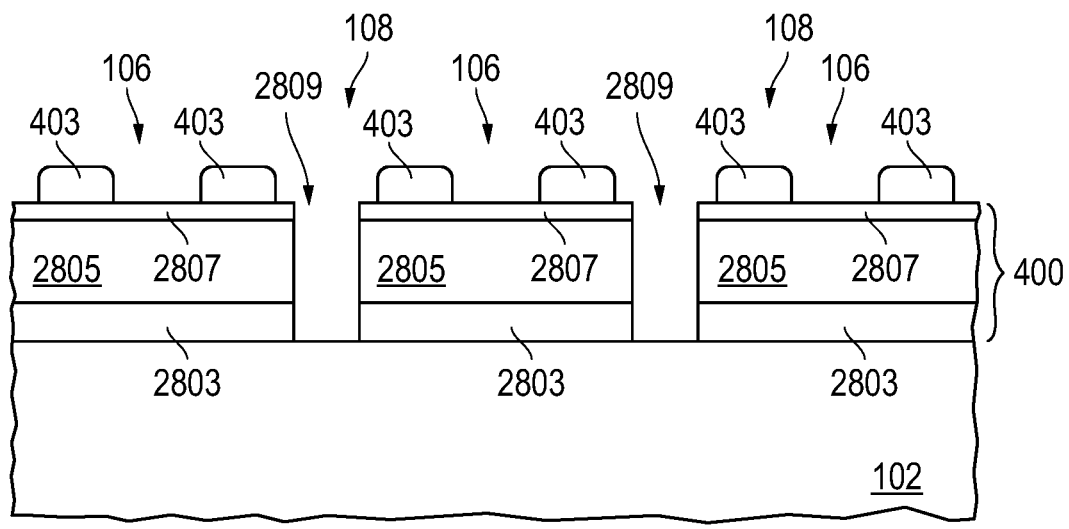
FIG. 27 includes an illustration of a cross-sectional view of the workpiece of FIG. 4 after removing portions of the plurality of layers within the scribe lanes, where the plurality of layers includes a sacrificial layer, a device section, and an interconnect section.
Figure 28:
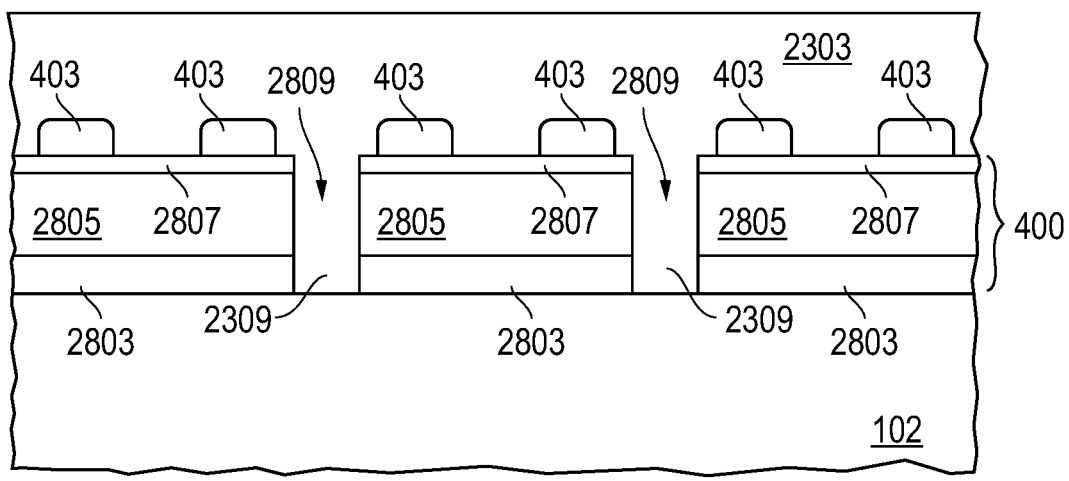
FIG. 28 includes an illustration of a cross-sectional view of the workpiece of FIG. 27 after forming a front-side polymer support layer.

In another set of embodiments, a sacrificial layer can be used to better control removing the base substrate 102 without significantly removing a device section of the plurality of layers 400. FIG. 27 includes a cross-sectional view after forming the spacer structures 403. The plurality of layers 400 includes a sacrificial layer 2803, a device section 2805, and an interconnect section 2807. The sacrificial layer 2803 can have a composition different from the base substrate 102 and a layer of the device section 2805 that contacts the sacrificial layer 2803. In an embodiment, the sacrificial layer 2803 can be an oxide, the base substrate 102 can be a Si wafer, and the layer contacting the other side of the sacrificial layer 2803 can be a doped Si layer. In a particular embodiment, the device section 2805 can include the doped Si layer, an epitaxial layer, a well region, and electronic components within the epitaxial layer, well region, or both. The interconnect section 2807 can include one or more interlevel levels that can each include an interlevel dielectric layer and an electrically conductive layer. Portions of the plurality of layers 400 can be removed to define trenches 2809 within the scribe lanes 108 to expose portions of the base substrate 102 within the scribe lanes 108. The polymer support layer 2303 is formed over spacer structures 403 and within the trenches 2809, as illustrated in FIG. 28.

Figure 29:
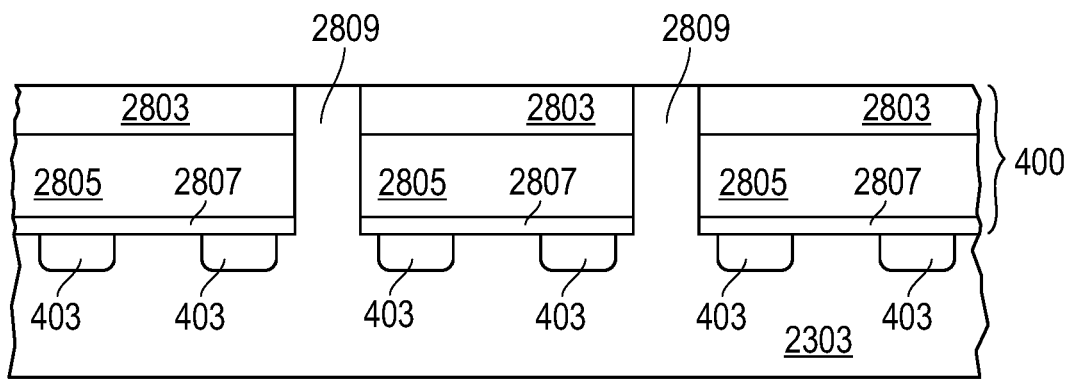
FIG. 29 includes an illustration of a cross-sectional view of the workpiece of FIG. 28 after removing the base substrate.

The workpiece is turned over, and the base substrate 102 is removed to expose the sacrificial layer 2803, as illustrated in FIG. 29. Removal of the base substrate 102 can be performed using any of the techniques as previously described with respect to FIGS. 6 and 7. The sacrificial layer 2803 can be used to aid in preventing or reducing the loss of layers within the plurality of layers 400. Without the sacrificial layer 2803, a significant portion of one or more layers within the device section 2805 may be removed when the principal material within the base substrate 102 and device section 2805 are the same, such as when the principal material is Si. The sacrificial layer 2803 can be removed to expose another layer within the device section 2805 of the plurality of layers 400. If needed or desired, a doping operation can be performed to improve contact resistance between the exposed layer within the device section 2805 and a subsequently-formed electrically conductive layer.

Figure 30:
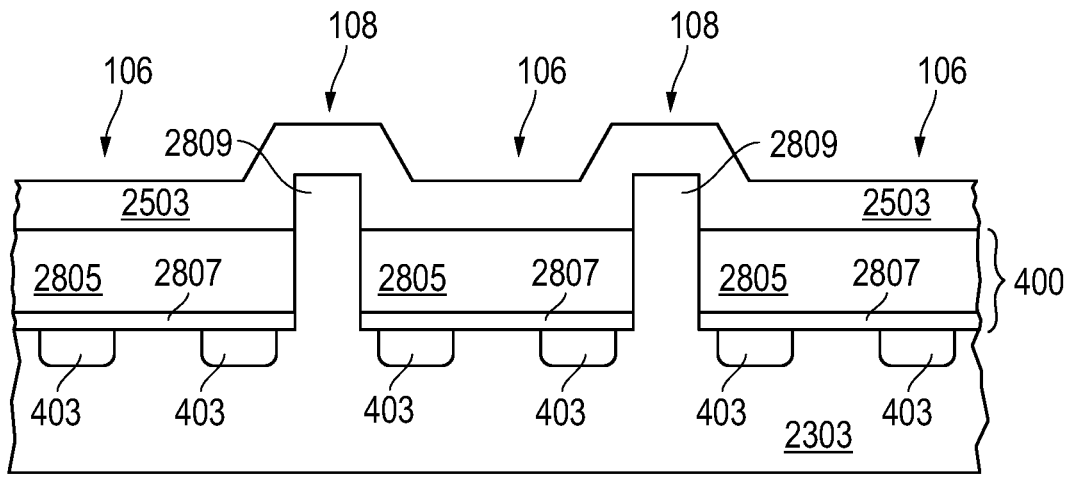
FIG. 30 includes an illustration of a cross-sectional view of the workpiece of FIG. 29 after removing the sacrificial layer and forming an electrically conductive layer along the back major surface of the workpiece.

In FIG. 30, the electrically conductive layer 2503 can be formed over portions of the remaining plurality of layers 400 and the polymer support layer 2303. Subsequent processing can be performed to remove portions of the electrically conductive layer 2503 between component regions and singulating the workpiece to form dies. Such processing operations are previously described and illustrated with respect to FIG. 25.

Figure 31:
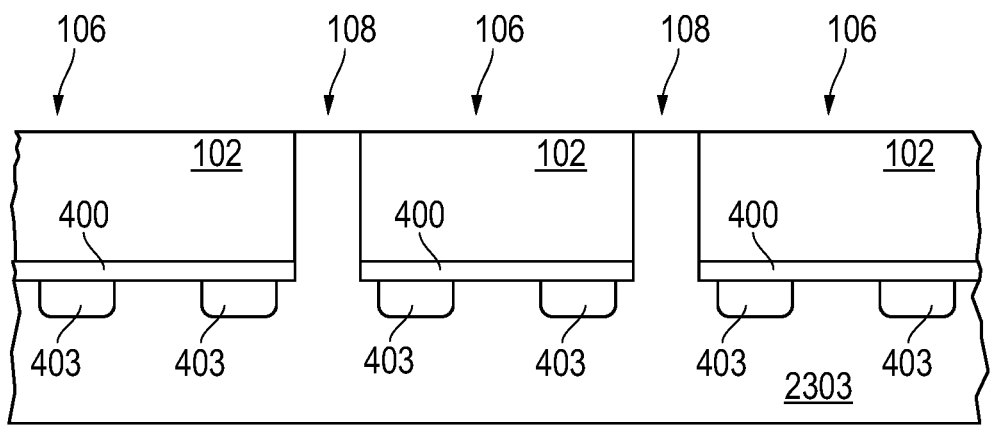
FIG. 31 includes an illustration of a cross-sectional view of the workpiece of FIG. 22 after removing a portion, and not all, of the base substrate along the back side of the workpiece.

In a further set of embodiments, thru-substrate vias can provide back-side contact to the base substrate 102, the plurality of layers 400, or both the base substrate 102 and plurality of layers 400. The starting point may be the workpiece as described and illustrated in FIG. 22. In FIG. 31, a portion of the base substrate 102 can be removed to expose the polymer support layer 2303. Unlike the embodiment of FIG. 23, the base substrate 102 does not need to be recessed or, if recessed, not recessed as much as in FIG. 23.

Figure 32:
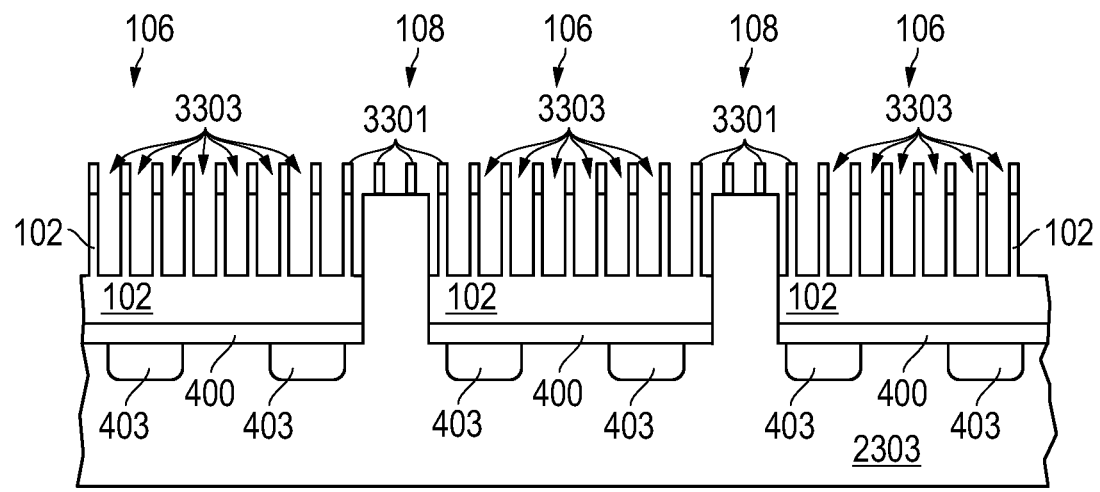
FIG. 32 includes an illustration of a cross-sectional view of the workpiece of FIG. 31 after removing portions of the base substrate to define trenches.
Figure 33:
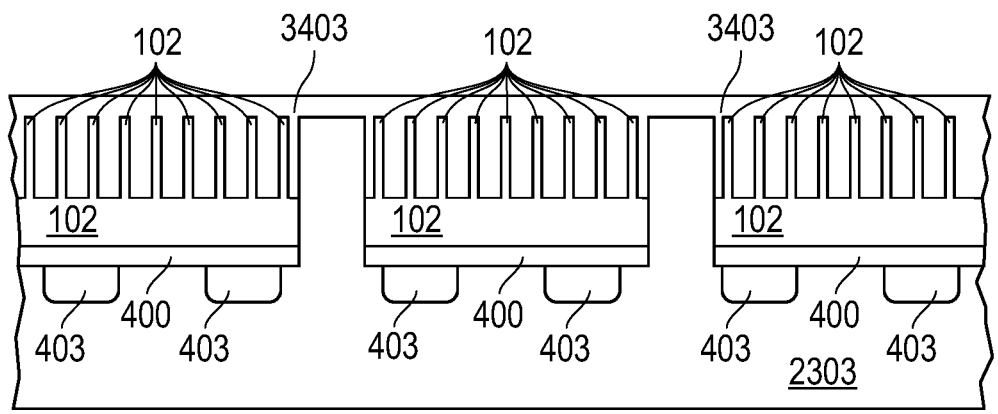
FIG. 33 includes an illustration of a cross-sectional view of the workpiece of FIG. 32 after forming an electrically conductive layer to fill the trenches.

In FIG. 32, a patterned masking layer 3301 can be formed that has openings where the base substrate 102 can be etched to define trenches 3303 that extend through a portion of the thickness of the base substrate 102. In another embodiment, the trenches 3303 may extend through all of the base substrate 102. In FIG. 33, the trenches 3303 (FIG. 32) can be filled with an electrically conductive layer 3403. The electrically conductive layer 3403 can include any of the materials and be formed using any of the formation techniques as previously described with respect to the electrically conductive layer 2503. Details regarding the formation of the trenches 3303 and filling the trenches 3303 with the electrically conductive layer 3403 can be found in U.S. Pat. No. 8,981,533, which is incorporated herein by reference in its entirety. For this particular embodiment, an insulating layer that lines the trenches is not formed, so that the electrically conductive layer 2503 can make an ohmic contact to portions of the base substrate 102 between the trenches 3303. The back-side major surface of the workpiece can be planarized. The planarization operation may leave portions of the electrically conductive layer 3403 over the portions 2309 of the polymer support layer 2303, as illustrated in FIG. 33, or may remove the electrically conductive layer 2305 from over the portions 2309 of the polymer support layer 2303 to expose the portions 2309 (not illustrated).

Figure 34:
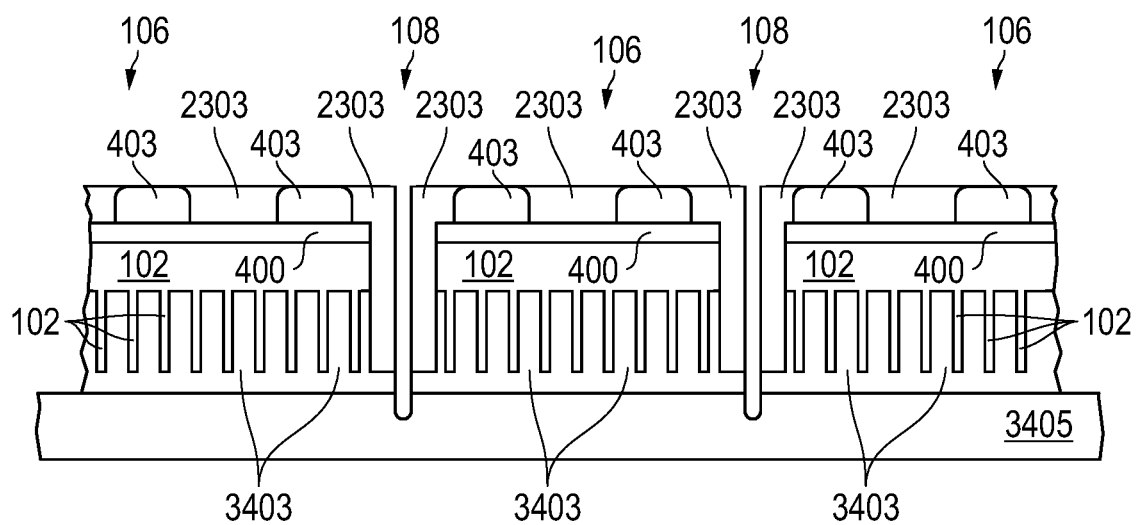
FIG. 34 includes an illustration of a cross-sectional view of the workpiece of FIG. 33 after removing portions of the front-side polymer support layer to expose the spacer structures and singulating the workpiece into dies.

The workpiece can be turned over and attached to a tape 3405 to continue with front-side processing as illustrated in FIG. 34. A portion of the polymer support layer 2303 can be removed, and the workpiece can be singulated along the scribe lanes 108 to form dies that include the component regions 106. The processing operations as previously described with respect to FIG. 10 can be used. In another embodiment, the spacer structures 403 may not be used. Bond pads 2013 and a laser ablation operation, such as described with respect to FIG. 20, may be used.

In a further embodiment, thru-substrate vias may be used to make an electrical connection between a component within the plurality of layers 400 and the back-side major surface of the workpiece. In this embodiment, an insulating layer may line a trench extending from the back-side surface to the component before forming an electrically conductive layer to fill the trench, so that the component is not electrically shorted to a remaining portion of the base substrate 102 or another feature of within the component regions 106.

After reading this specification, skilled artisans will understand that many other designs and processing sequences can be used to achieve the needs or desires for an application. The embodiments as described and illustrated herein are meant to be exemplary and do not limit the scope of the present invention.

Embodiments as described herein include workpieces that have a plurality of layers that, by itself, may be incapable of providing sufficient mechanical support during processing operations. Thus, relatively thick base substrates do not need to be retained until the workpiece is singulated. Accordingly, a substrate substantially larger than a die can be processed so that a process sequence may only need to be performed once for many dies that can be singulated from the substrate, as opposed performing the process sequence for each die, which could be more than 100 times. The process is well suited for electronic devices where a thick base substrate may not provide the best electrical characteristics (for example, a thick Si substrate under a III-V semiconductor device, or resistance associated with a drain or collector may be higher as a semiconductor substrate is thicker). Many embodiments can use one or more polymer support layers to ensure the workpiece has a sufficient thickness to allow processing to be performed at a wafer level without significant risk of relatively thin device layers from becoming damaged during processing. If needed or desired, spacer structures can be used to assist in ensuring a sufficient thickness of a polymer support layer remains.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1. A process can including providing a workpiece having a first major surface and a second major surface opposite the first major surface, wherein the workpiece includes a base substrate and a plurality of layers overlying the base substrate, wherein the plurality of layers is closer to the first major surface than the second major surface. The process can also include forming a polymer support layer along the first major surface of the workpiece. The process can further include removing at least 50% of a thickness of the base substrate within a component region of the workpiece, wherein the component region includes an electronic device, and after removing at least 50% of the thickness of the base substrate, a combined thickness of the workpiece and polymer support layer within the component region is at least 30 microns; and singulating the workpiece into a plurality of dies after removing at least 50% of the thickness of the base substrate.

Embodiment 2. The process of Embodiment 1, wherein the base substrate includes a semiconductor wafer.

Embodiment 3. The process of Embodiment 1, wherein the polymer support layer is permanently attached to the first major surface.

Embodiment 4. The process of Embodiment 1 further includes forming a spacer structure along the first major surface of the workpiece before forming the polymer support layer.

Embodiment 5. The process of Embodiment 4, wherein forming a spacer structure includes forming an electrically conductive member along the first major surface of the workpiece.

Embodiment 6. The process of Embodiment 4 further includes removing a portion of the polymer support layer to expose the spacer structure.

Embodiment 7. The process of Embodiment 6, wherein:
providing the workpiece includes providing the workpiece, wherein the base substrate is a wafer and has a diameter of at least 200 mm,
forming the spacer structure includes forming electrically conductive members that are electrically connected to terminals of the electronic device, wherein the electrically conductive members have a height of at least 30 microns,
forming the polymer support layer includes:
  forming a molding compound along the first major surface of the workpiece; and
  curing the molding compound to form the polymer support layer,
removing the portion of the polymer support layer includes grinding away the molding compound to expose the electrically conductive members,
removing at least 50% of a thickness of the base substrate includes removing at least 80% of the thickness of the base substrate within the component region of the workpiece, wherein after removing at least 80% of the thickness of the base substrate, a combined thickness of the workpiece and polymer support layer within the component region has a thickness in a range from 75 microns to 300 microns.

Embodiment 8. The process of Embodiment 1, wherein the plurality of layers further includes a bond pad, and the process further includes selectively removing a portion of the polymer support layer to expose the bond pad.

Embodiment 9. The process of Embodiment 1 further includes forming a heat sink along the second major surface of the workpiece after removing at least 50% of the thickness of the base substrate.

Embodiment 10. The process of Embodiment 1, wherein the plurality of layers includes a semiconductor layer that is a current-carrying layer or region of an electronic device within the component region, or a heterojunction between semiconductor layers within the component region, wherein the heterojunction has a corresponding two-dimensional charge carrier gas.

Embodiment 11. A process can include providing a workpiece having a first major surface and a second major surface opposite the first major surface, wherein the workpiece includes a base substrate and a plurality of layers overlying the base substrate, wherein the plurality of layers is closer to the first major surface than to the second major surface. The process can also include forming a trench along the first major surface of the workpiece and extending at least to the base substrate; forming a polymer support layer that extends into the trench and contacts the base substrate; removing at least a portion of a thickness of the base substrate within a component region to expose the polymer support layer within the trench, wherein within the trench and after removing at least the portion of the base substrate, the polymer support layer has a height of at least 30 microns as measured within the trench, and the component region includes an electronic device; and singulating the workpiece into a plurality of dies after removing at least a portion of the thickness of the base substrate.

Embodiment 12. The process of Embodiment 11, wherein base substrate has a dimension along a major surface of the base substrate, wherein the dimension is at least 100 mm.

Embodiment 13. The process of Embodiment 11, wherein the plurality of layers includes a sacrificial layer, and removing at least a portion of a thickness of the base substrate is performed to expose the sacrificial layer.

Embodiment 14. The process of Embodiment 11, wherein removing at least the portion of the thickness of the base substrate is performed such that at least a portion of the thickness of the base substrate remains within a component region.

Embodiment 15. The process of Embodiment 11 further includes forming an electrically conductive layer along the second major surface of the workpiece before singulating the workpiece.

Embodiment 16. The process of Embodiment 15 further includes removing a portion of the electrically conductive layer along a scribe lane before singulating the workpiece.

Embodiment 17. An electronic device can include a plurality of layers having a first major surface and a second major surface opposite the first major surface; a polymer support layer along the first major surface of the workpiece, wherein within a component region, a combined thickness of polymer support layer and the plurality of layers is at least 30 microns; and a back-side member along the second major surface, wherein at least one peripheral side of the polymer support layer and at least one peripheral side of the back-side member are substantially coterminous.

Embodiment 18. The electronic device of Embodiment 17, wherein each of the polymer support layer and the back-side member include a molding compound.

Embodiment 19. The electronic device of Embodiment 17, wherein a particular layer within the plurality of layers is a semiconductor layer, and the plurality of layers has a cumulative thickness of at most 9 microns.

Embodiment 20. The electronic device of Embodiment 17, wherein all corresponding pairs of peripheral sides of the polymer support layer and the back-side member are substantially coterminous.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process comprising:
    providing a workpiece having a first major surface and a second major surface opposite the first major surface, wherein the workpiece includes a base substrate and a plurality of layers overlying the base substrate, and the plurality of layers is closer to the first major surface than to the second major surface;
    removing a portion of the plurality of layers to define a trench that is adjacent to the first major surface and extends through the plurality of layers and extends at least to the base substrate;
    forming a polymer support layer along the first major surface of the workpiece and within the trench;
    removing a portion of the base substrate along the second major surface of the workpiece, wherein removing the portion of the base substrate exposes raised portions of the polymer support layer and forms a remaining portion of the base substrate;
    forming an electrically conductive layer that contacts the remaining portion of the base substrate and the raised portions of the polymer support layer; and
    removing a portion of the electrically conductive layer and parts of the raised portions of the polymer support layer, wherein remaining portions of the electrically conductive layer are spaced apart from each other by remaining parts of the raised portions of the polymer support layer, and, after removing the portion of the electrically conductive layer, the remaining portions of the electrically conductive layer contact the remaining parts of the raised portions of the polymer support layer.

2. The process of claim 1, wherein after removing the portion of the base substrate, an exposed surface of the remaining portion of the base substrate is recessed to an elevation below an elevation of a distal surface of raised portions of the polymer support layer.

3. The process of claim 1, wherein forming the electrically conductive layer is performed such that the electrically conductive layer is formed over the raised portions of the polymer support layer.

4. The process of claim 3, wherein removing portions of the electrically conductive layer and parts of the raised portions of the polymer support layer is performed using a grinding, planing or polishing technique.

5. The process of claim 1, wherein forming the electrically conductive layer comprises plating or depositing by physical vapor deposition the electrically conductive layer.

6. The process of claim 1, further comprising singulating the workpiece after removing the portion of the electrically conductive layer.

7. The process of claim 1, further comprising singulating the workpiece along a scribe lane to form a die that includes a component region that includes the plurality of layers, wherein singulating is performed while a portion of the electrically conductive layer is along the raised portions of the polymer support layer.

8. The process of claim 1, further comprising forming a spacer structure along the first major surface of the workpiece before forming the polymer support layer.

9. The process of claim 8, wherein forming the spacer structure comprises forming an electrically conductive member.

10. The process of claim 8, further comprising removing a first major surface portion of the polymer support layer along the first major surface to expose the spacer structure.

11. The process of claim 10, wherein removing the first major surface portion of the polymer support layer is performed after forming the electrically conductive layer.

12. The process of claim 1, wherein the base substrate includes a semiconductor wafer.

13. The process of claim 1, wherein the plurality of layers comprise a device section, wherein the device section includes an epitaxial layer, a well region, or an electronic component within the epitaxial layer or the well region.

14. A process comprising:
    providing a workpiece having a first major surface and a second major surface opposite the first major surface, wherein the workpiece includes a base substrate and a plurality of layers overlying the base substrate, and the plurality of layers is closer to the first major surface than to the second major surface;
    removing a portion of the plurality of layers to define a first trench adjacent to the first major surface and extending through the plurality of layers and at least to the base substrate;

forming a polymer support layer along the first major surface of the workpiece and within the first trench;

forming a patterned masking layer along the second major surface and over the base substrate;

etching the base substrate to define second trenches adjacent to the second major surface and extending into the base substrate; and forming an electrically conductive layer that extends into the second trenches in the base substrate, wherein:

after forming the electrically conductive layer, the electrically conductive layer contacts portions of the base substrate that are disposed between the plurality of layers and bottoms of the second trenches within the base substrate, and etching the base substrate and forming the electrically conductive layer are performed after forming the polymer support layer.

15. The process of claim 14, wherein forming the electrically conductive layer is performed such that the electrically conductive layer contacts sidewalls of the second trenches in the base substrate.

16. The process of claim 14, further comprising removing the patterned masking layer after etching the base substrate and before forming the electrically conductive layer.

17. A process comprising:

providing a workpiece having a first major surface and a second major surface opposite the first major surface, wherein the workpiece includes a base substrate and a plurality of layers including a device section, and wherein the plurality of layers is disposed between the base substrate and the first major surface, and the plurality of layers is closer to the first major surface than the second major surface;

removing a portion of the plurality of layers to define a trench that is adjacent to the first major surface and extends through the plurality of layers;

forming a polymer support layer along the first major surface of the workpiece and within the trench;

removing the base substrate within a component region of the workpiece, wherein, after removing the base substrate, a distal surface of the polymer support layer and the plurality of layers are exposed along the second major surface of the workpiece; and forming an electrically conductive layer along the second major surface of the workpiece, wherein the electrically conductive layer contacts the plurality of layers and is electrically connected to the device section.

18. The process of claim 17, wherein:

the plurality of layers further comprises a sacrificial layer disposed between the base substrate and the device section; and removing the base substrate is performed such that the sacrificial layer becomes exposed along the second major surface.

19. The process of claim 18, further comprising removing the sacrificial layer to expose the device section, wherein forming the electrically conductive layer is performed such that the electrically conductive layer contacts the device section.

20. The process of claim 17, wherein removing the base substrate comprises removing all of the base substrate.

* * * * *